United States Patent
Kobayakawa

(10) Patent No.: US 9,899,357 B2
(45) Date of Patent: Feb. 20, 2018

(54) LED MODULE

(71) Applicant: ROHM CO., LTD., Kyoto (JP)

(72) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/486,834

(22) Filed: Apr. 13, 2017

(65) Prior Publication Data

US 2017/0345800 A1  Nov. 30, 2017

(30) Foreign Application Priority Data

May 26, 2016 (JP) ................................. 2016-104959

(51) Int. Cl.
*H01L 33/62* (2010.01)
*H01L 25/075* (2006.01)
*H01L 23/482* (2006.01)
*H01L 23/495* (2006.01)

(52) U.S. Cl.
CPC .......... *H01L 25/0753* (2013.01); *H01L 33/62* (2013.01); *H01L 23/4824* (2013.01); *H01L 23/49503* (2013.01)

(58) Field of Classification Search
CPC ................. H01L 33/62; H01L 23/4824; H01L 23/49503
USPC ........................................................ 257/692
See application file for complete search history.

(56) References Cited

U.S. PATENT DOCUMENTS

| | | | | |
|---|---|---|---|---|
| 2005/0156187 A1* | 7/2005 | Isokawa | ............ | H01L 23/49838 257/100 |
| 2005/0173793 A1* | 8/2005 | Rohrmoser | ........... | H01L 21/561 257/724 |
| 2007/0001180 A1* | 1/2007 | Obara | ..................... | H01L 33/62 257/98 |
| 2009/0145647 A1* | 6/2009 | Tanaka | .................... | H01L 33/62 174/260 |
| 2009/0189174 A1* | 7/2009 | Lee | ........................ | H01L 25/167 257/99 |
| 2010/0123157 A1* | 5/2010 | Chen | ....................... | H01L 33/62 257/99 |
| 2011/0068448 A1* | 3/2011 | Camacho | ................ | H01L 24/48 257/676 |
| 2012/0106584 A1* | 5/2012 | Katsuki | ................ | G11B 7/1275 372/50.12 |

(Continued)

FOREIGN PATENT DOCUMENTS

JP   2013-026510   2/2013

*Primary Examiner* — George Fourson, III

(74) *Attorney, Agent, or Firm* — Hamre, Schumann, Mueller & Larson, P.C.

(57) ABSTRACT

An LED module includes: a substrate having a main surface and a back surface which face in opposite directions from each other in a thickness direction; a first LED chip including a first electrode pad bonded to a surface facing the same direction as the main surface; a first wire having one end bonded to the first electrode pad; and a wiring pattern having a main surface electrode formed in the main surface, wherein the main surface electrode includes a first die pad portion which supports the first LED chip, and when viewed from the thickness direction, the first die pad portion includes a main pad portion to which the first LED chip is bonded and an auxiliary pad portion which protrudes from the main pad portion in a direction toward a position of the first electrode pad from the center position in the first LED chip.

30 Claims, 21 Drawing Sheets

(56) References Cited

U.S. PATENT DOCUMENTS

| | | | |
|---|---|---|---|
| 2015/0270462 A1* | 9/2015 | Ito | H01L 33/62 257/98 |
| 2017/0186930 A1* | 6/2017 | Kobayakawa | H01L 33/647 |

* cited by examiner

LED MODULE

CROSS-REFERENCE TO RELATED APPLICATION

This application is based upon and claims the benefit of priority from Japanese Patent Application No. 2016-104959, filed on May 26, 2016, the entire contents of which are incorporated herein by reference.

TECHNICAL FIELD

The present disclosure relates to an LED module including an LED chip.

BACKGROUND

A conventional LED module includes a substrate, a wiring pattern formed on the substrate, and an LED chip (light emitting element) mounted on the substrate. The wiring pattern includes a main surface electrode formed on a main surface of the substrate, and the main surface electrode has a die pad portion for supporting the LED chip. The LED module is formed by sequentially performing a die bonding process of mounting the LED chip on the die pad portion and a wire bonding process of connecting the LED chip and the wiring pattern with wires.

FIG. 19A is a view for explaining the die bonding process. The die bonding process is performed using an existing die bonder. Specifically, an adhesive paste (not shown) such as silver paste is applied on a die pad portion 911 of a wiring pattern 910 formed on a substrate 900. The adhesive paste may be also applied to the bottom of an LED chip 920. Then, an adsorption collet 930 is used to place the LED chip 920 on the die pad portion 911. Thereafter, the LED chip 920 is bonded to the die pad portion 911 by reflowing the adhesive paste or the like in a heating furnace.

FIG. 19B is a view for explaining the wire bonding process. The wire bonding process is performed using an existing wire bonder. Specifically, first, a tip portion of a wire 950 is extracted from a capillary 940 of a wire bonder and is melted. Then, the melted tip portion is pressed against an electrode pad on the upper surface of the LED chip 920 (first bonding step). Next, the capillary 940 is moved while pulling out the wire 950 from the capillary 940, and the wire 950 is firmly pressed against the upper surface of a wire bonding portion 912 of the wiring pattern 910 and cut by the capillary 940 (second bonding step). As a result, the electrode pad on the upper surface of the LED chip 920 and the wire bonding portion 912 are electrically connected by the wire 950. FIG. 19B shows a case where the first bonding is performed on the electrode pad on the upper surface of the LED chip 920 and then the second bonding is performed on the wire bonding portion 912. However, on the contrary, the first bonding may be performed on the wire bonding portion 912 and the second bonding may be then performed on the electrode pad on the upper surface of the LED chip 920. Typically, a pressing force is stronger in the second bonding than in the first bonding.

FIGS. 20A to 20C are views illustrating a problem caused when mounting the LED chip 920 on the substrate 900. In the die bonding process described above, the LED chip 920 is arranged at a preset position on the die pad portion 911, but misalignment may occur depending on the accuracy of the die bonder which is a die bonding device. Due to this misalignment, the LED chip 920 is sometimes placed on the outside of the die pad portion 911 (see FIGS. 20A and 20B). At this time, when the electrode exists above a portion protruding from the die pad portion 911, there is a possibility that the bonding of the LED chip 920 is peeled off or shifted due to a stress applied by wire bonding (indicated by a solid arrow in FIG. 20C). In particular, in the case of a two-wire type LED chip having two electrode pads on its upper surface, one of the electrode pads is often disposed at an edge in a plan view, which makes such a problem noticeable. In the conventional LED module, for the purpose of avoiding this problem, the die pad portion 911 is uniformly formed to be large in all directions from the outer periphery of the LED chip 920 in a plan view. Therefore, the size of the LED module in a plan view has to be increased.

SUMMARY

The present disclosure provides some embodiments of an LED module which is capable of being made compact and preventing an electrode pad for bonding wires from protruding from a die pad portion even when misalignment occurs during die bonding.

According to one embodiment of the present disclosure, there is provided an LED module including: a substrate having a main surface and a back surface which face in opposite directions from each other in a thickness direction; at least one first LED chip including a first electrode pad bonded to a surface facing the same direction as the main surface; a first wire having one end bonded to the first electrode pad; and a wiring pattern having a main surface electrode formed in the main surface. The main surface electrode includes a first wire bonding portion to which the other end of the first wire is bonded, and a first die pad portion which supports the first LED chip. The first electrode pad is biased to an outer edge of the first LED chip from a center position in the first LED chip when viewed from the thickness direction. The first die pad portion includes a main pad portion to which the first LED chip is bonded when viewed from the thickness direction, and an auxiliary pad portion which is formed integrally with the main pad portion and protrudes from the main pad portion in a direction toward a position of the first electrode pad from the center position of the first LED chip when viewed from the thickness direction.

In some embodiments, the first die pad portion has two connection points at which an outer edge of the main pad portion and an outer edge of the auxiliary pad portion intersect each other when viewed from the thickness direction.

In some embodiments, a maximum dimension of the auxiliary pad portion in a direction in which the two connection points are separated from each other is larger than a distance between the two connection points.

In some embodiments, the first LED chip has a rectangular shape when viewed from the thickness direction.

In some embodiments, the first electrode pad is disposed on one diagonal line of the first LED chip.

In some embodiments, the first wire bonding portion is disposed on an extension of the diagonal line.

In some embodiments, the main pad portion has a rectangular shape when viewed from the thickness direction.

In some embodiments, a shape of the main pad portion is analogous to that of the first LED chip when viewed from the thickness direction.

In some embodiments, when viewed from the thickness direction, the auxiliary pad portion has a first side which extends from one of the two connection points in a direction perpendicular to a side of the main pad portion connected to the one connection point, a second side which extends from the other of the two connection points in the direction perpendicular to a side of the main pad portion connected to the other connecting point, a third side which extends from an end portion of the first side in a direction parallel to the second side, and a fourth side which extends from an end portion of the second side in a direction parallel to the first side and is connected to the third side.

In some embodiments, when the first LED chip is bonded to a predetermined position in the main pad portion, the first electrode pad is positioned at an intersection of a perpendicular bisector of the third side of the auxiliary pad portion and a perpendicular bisector of the fourth side of the auxiliary pad portion when viewed from the thickness direction.

In some embodiments, the third side and the fourth side of the auxiliary pad portion have the same length.

In some embodiments, when the first LED chip is bonded to a predetermined position of the main pad portion, the auxiliary pad portion has a circular shape which centers on the position of the first electrode pad and has a circular arc passing through the two connection points, and does not overlap the main pad portion, when viewed from the thickness direction.

In some embodiments, the first LED chip further includes a second electrode pad which is bonded to a surface facing the same direction as the main surface and is separated from the first electrode pad when viewed from the thickness direction.

In some embodiments, a distance between the second electrode pad and the center position in the first LED chip is shorter than a distance between the first electrode pad and the center position in the first LED chip when viewed from the thickness direction.

In some embodiments, the surface to which the second electrode pad is bonded is closer to the back surface side than the surface to which the first electrode pad is bonded, when viewed from the thickness direction.

In some embodiments, the first LED chip includes a semiconductor substrate, an n-type semiconductor layer, an active layer and a Hype semiconductor layer, the first electrode pad is an n side electrode pad bonded to the n-type semiconductor layer, and the second electrode pad is a p side electrode pad bonded to the p-type semiconductor layer.

In some embodiments, the LED module further includes: a second wire having one end bonded to the second electrode pad, and the main surface electrode includes a second wire bonding portion to which the other end of the second wire is bonded.

In some embodiments, the main surface electrode includes a connection wiring connected to the first die pad portion and the second wire bonding portion.

In some embodiments, the wiring pattern has a back surface electrode formed in the back surface of the substrate.

In some embodiments, the wiring pattern includes a through electrode which is connected to the main surface electrode and the back surface electrode and passes through the substrate.

In some embodiments, the through electrode is a via hole which penetrates through the substrate in the thickness direction and is filled with a conductive material.

In some embodiments, the through electrode is a plating formed in an inner surface of a through portion penetrating through the substrate in the thickness direction.

In some embodiments, the LED module further includes: an insulating film covering a portion of the wiring pattern.

In some embodiments, the LED module further includes: a housing disposed on the main surface of the substrate so as to surround the first LED chip.

In some embodiments, the LED module includes a plurality of first LED chips.

In some embodiments, the LED module includes three first LED chips which emit green light, blue light and red light, respectively.

In some embodiments, the LED module further includes a second LED chip of a one-wire type including: a wire electrode pad to which one end of a third wire is bonded; and a bottom electrode which is positioned in an opposite side of the wire electrode pad and is bonded to the main surface electrode.

In some embodiments, the main surface electrode includes a second die pad portion which supports the second LED chip and to which the bottom electrode is conductively bonded.

In some embodiments, the main surface electrode further includes a third wire bonding portion to which the other end of the third wire is bonded.

In some embodiments, the LED module includes two first LED chips and one second LED chip and the one LED chip emits red light.

DETAILED DESCRIPTION

Figure 1A:
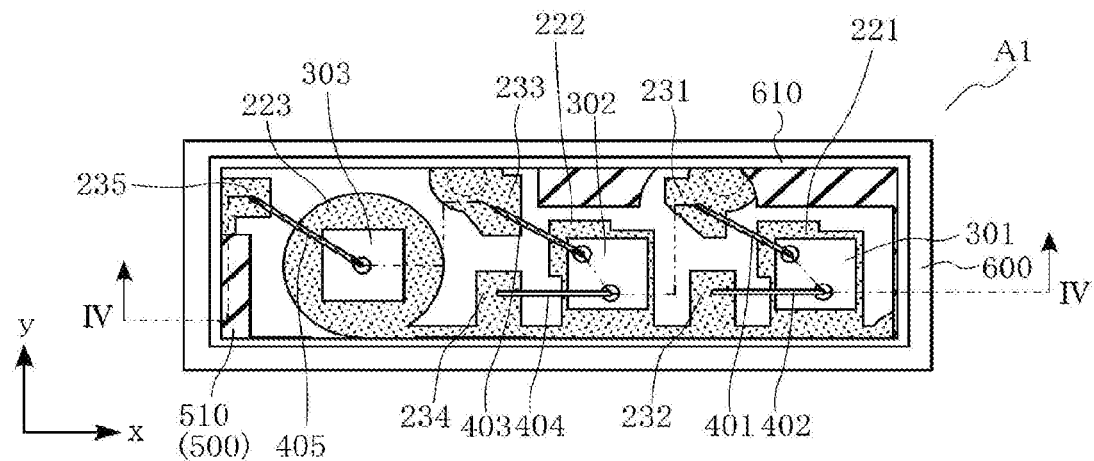
FIGS. 1A to 1C are plan views of a main part of an LED module according to a first embodiment of the present disclosure.
Figure 1B:
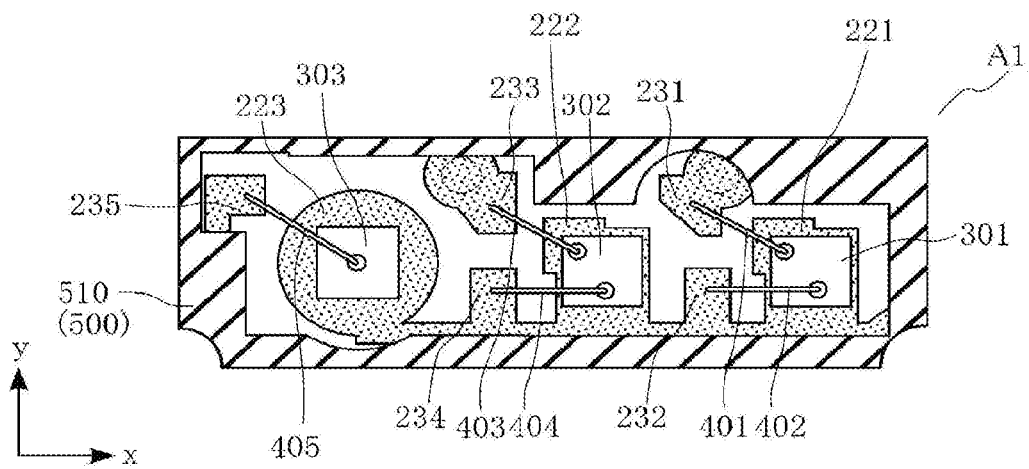

Some exemplary embodiments of the present disclosure will now be described in detail with reference to the drawings.

An LED module A1 according to a first embodiment of the present disclosure includes a module substrate 100, a wiring pattern 200, a plurality of LED chips (three LED chips 301, 302 and 303 in this embodiment), a plurality of wires (five wires 401, 402, 403, 404 and 405 in this embodiment), an insulating film 500, a housing 600, and a sealing resin 700.

Figure 1C:
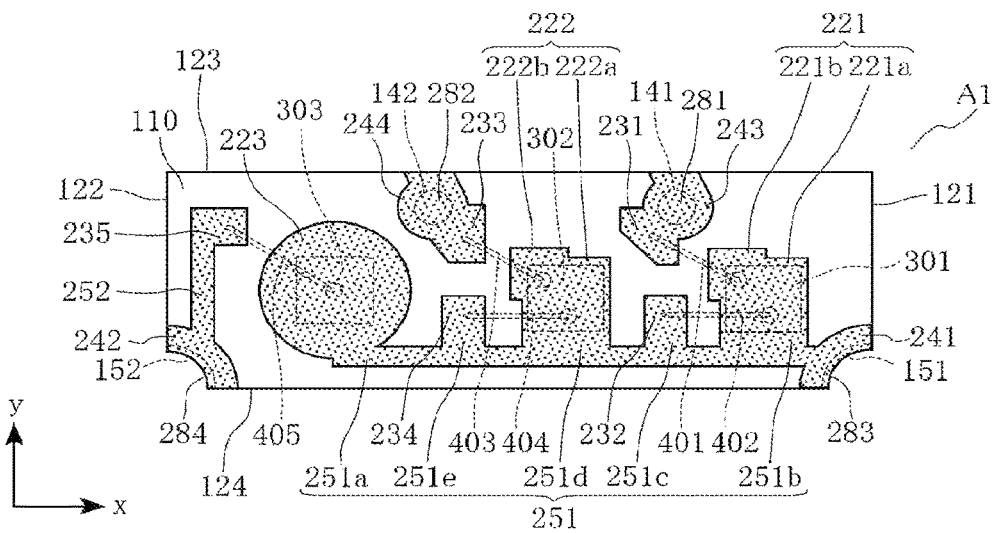
Figure 2:
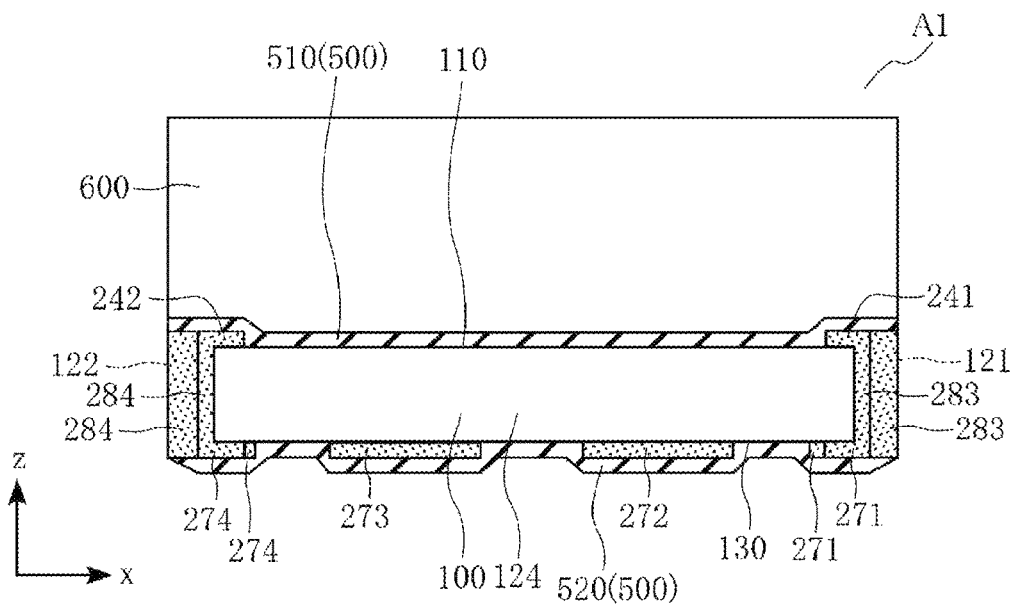
FIG. 2 is a side view of the LED module of FIGS. 1A to 1C.
Figure 3:
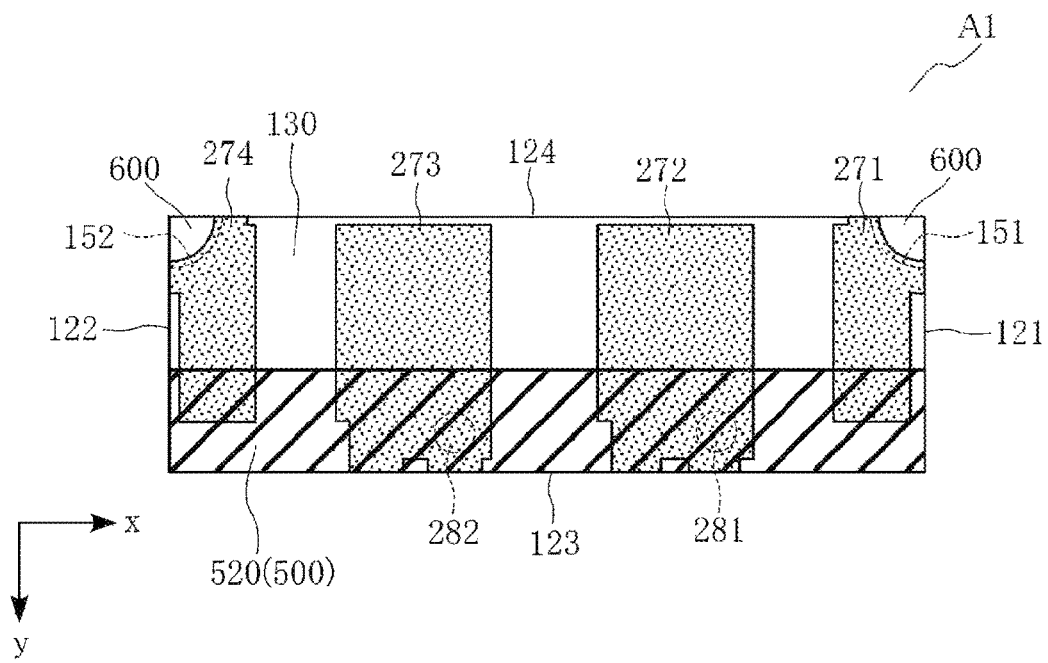
FIG. 3 is a bottom view of the LED module of FIGS. 1A to 1C.
Figure 4:
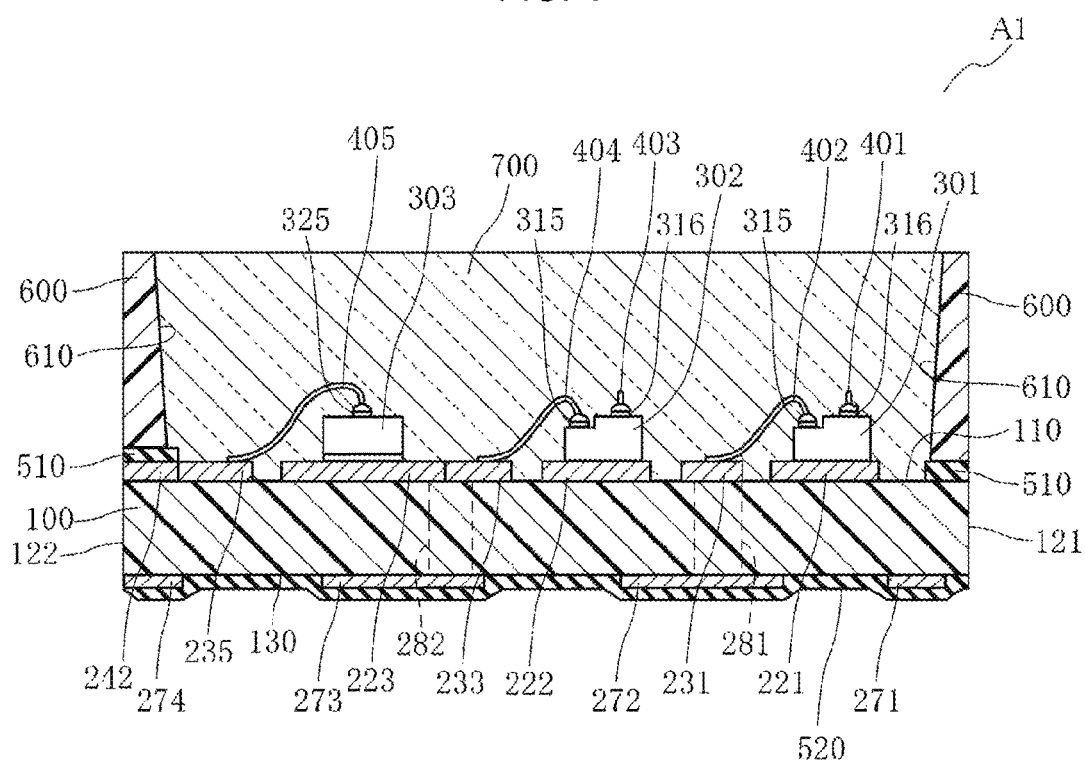
FIG. 4 is a sectional view taken along line IV-IV in FIG. 1A.

FIGS. 1A to 4 are views illustrating the LED module A1 according to the first embodiment. FIGS. 1A to 1C are plan views of a main part of the LED module A1. The sealing resin 700 is not shown in FIG. 1A, the sealing resin 700 and the housing 600 are not shown in FIG. 1B, the sealing resin 700, the housing 600 and the insulating film 500 are not shown in FIG. 1C. In addition, the plurality of LED chips 301 to 303 and the plurality of wires 401 to 405 are shown in phantom in FIG. 1C. FIG. 2 is a side view of the LED module A1. FIG. 3 is a bottom view of the LED module A1. In addition, the insulating film 500 is shown in phantom in FIG. 3. FIG. 4 is a sectional view taken along line IV-IV in FIG. 1A. For convenience of understanding, the wiring pattern 200 and the insulating film 500 are hatched in FIGS. 1A to 3. In this embodiment, a thickness direction of the LED module A1 is defined as a z direction and directions perpendicular to the z direction are defined as an x direction and a y direction. In each of the x direction, they direction and the z direction, the direction indicated by an arrow is defined as a +direction, and the opposite direction is defined as a −direction. For example, in FIGS. 1A to 1C, a +x direction refers to the right side of the drawing.

The module substrate 100 is made of an insulating material. An example of such an insulating material may include a glass epoxy resin. The module substrate 100 has a rectangular shape extending in the x direction when viewed from the z direction. The module substrate 100 has a substrate main surface 110, four substrate side surfaces 121, 122, 123 and 124, and a substrate back surface 130. The substrate main surface 110 and the substrate back surface 130 face in opposite directions from each other in the z direction. The substrate side faces 121, 122, 123 and 124 face the +x direction, the −x direction, the +y direction and the −y direction, respectively. Each of the substrate side faces 121 to 124 is connected to both the substrate main face 110 and the substrate back face 130.

Two through-holes 141 and 142 and two corner grooves 151 and 152 are formed in the module substrate 100.

The through-holes 141 and 142 penetrate through the module substrate 100 in the thickness direction (the z direction) and reach the substrate back surface 130 from the substrate main surface 110. The through-holes 141 and 142 are biased to the +y direction side when viewed from the z direction. The through-holes 141 and 142 are also called via holes.

The corner groove 151 is recessed from the substrate side surfaces 121 and 124. The corner groove 151 reaches the substrate main surface 110 and the substrate back surface 130 in the thickness direction (the z direction) of the module substrate 100. The corner groove 152 is recessed from the substrate side surfaces 122 and 124. The corner groove 152 reaches the substrate main surface 110 and the substrate back surface 130 in the thickness direction (the z direction) of the module substrate 100. The section perpendicular to the z direction of the corner grooves 151 and 152 has a quarter circle shape.

The wiring pattern 200 forms a current path for supplying power to each of the LED chips 301 to 303. The wiring pattern 200 is in electrical conduction with each of the LED chips 301 to 303. The wiring pattern 200 is made of, e.g., Cu, Ni, Ti, Au or the like alone or in combination. The wiring pattern 200 is formed on the module substrate 100, for example, by plating.

The wiring pattern 200 includes a main surface electrode 210, a plurality of back surface electrodes (four back surface electrodes 271, 272, 273 and 274 in this embodiment), a plurality of through electrodes (two through electrodes 281 and 282 in this embodiment) and a plurality of corner groove electrodes (two corner groove electrodes 283 and 284 in this embodiment).

The main surface electrode 210 is formed in the substrate main surface 110 of the module substrate 100. In this embodiment, as shown in FIG. 1C, the main surface electrode 210 includes three die pad portions 221, 222 and 223, five wire bonding portions 231, 232, 233, 234 and 235, two quarter annular wires 241 and 242, two circular wires 243 and 244, and two connecting wires 251 and 252.

The die pad portions 221, 222 and 223 are parts for supporting the LED chips 301, 302 and 303, respectively. In this embodiment, the die pad portions 221 to 223 are spaced apart from each other in the x direction. The die pad portions 221 and 222 correspond to a "first die pad portion" recited in the claims and the die pad portion 223 corresponds to a "second die pad portion" recited in the claims.

In this embodiment, the die pad portion 221 includes a main pad portion 221a and an auxiliary pad portion 221b. Details of the main pad portion 221a and the auxiliary pad portion 221b will be described later.

In this embodiment, the die pad portion 222 includes a main pad portion 222a and an auxiliary pad portion 222b. The main pad portion 222a and the auxiliary pad portion 222b have the same configuration as the main pad portion 221a and the auxiliary pad portion 221b, respectively.

In this embodiment, the die pad portion 223 has a circular shape.

One end of the wire 401 is bonded to the wire bonding portion 231. One end of the wire 402 is bonded to the wire bonding portion 232. In this embodiment, the wire bonding portion 232 has a rectangular shape when viewed from the z direction. One end of the wire 403 is bonded to the wire bonding portion 233. One end of the wire 404 is bonded to the wire bonding portion 234. In this embodiment, the wire bonding portion 234 has a rectangular shape when viewed from the z direction. One end of the wire 405 is bonded to the wire bonding portion 235. In this embodiment, the wire bonding portion 235 has a rectangular shape when viewed from the z direction. The wire bonding portions 231 to 235 are spaced apart from each other. The wire bonding portions 231 and 233 correspond to a "first wire bonding portion" recited in the claims, the wire bonding portions 232 and 234 correspond to a "second wire bonding portion" recited in the claims, and the wire bonding portion 235 corresponds to a "third wire bonding portion" recited in the claims.

The quarter annular wiring 241 is formed in the vicinity of a portion of the substrate main surface 110 connected to the corner groove 151. The quarter annular wiring 242 is formed in the vicinity of a portion of the substrate main surface 110 connected to the corner groove 152.

The circular wirings 243 and 244 have a circular shape when viewed from the z direction. In this embodiment, the circular wirings 243 and 244 are disposed near the edge of the substrate main surface 110 in the +y direction. The circular wirings 243 and 244 are spaced apart in the x direction and arranged side by side in the x direction. The circular wiring 243 is connected to the wire bonding portion 231 from the −x direction and the −y direction. The circular wiring 244 is connected to the wire bonding portion 233 from +x direction and −y direction.

The connection wiring 251 connects the die pad portions 221 to 223, the wire bonding portions 232 and 234, and the quarter annular wiring 241. The connection wiring 251 includes a strip portion 251a and a plurality of branch portions 251b, 251c, 251d and 251e.

The strip portion 251a extends in the −x direction from the quarter annular wiring 241 and is connected to the die pad portion 223. The strip portion 251a is arranged near the edge of the substrate main surface 110 in the −y direction. The branch portion 251b extends in the +y direction from a part of the strip portion 251a and is connected to the edge of the die pad portion 221 in the −y direction. The branch portion 251b overlaps the die pad portion 221 in the x direction. The branch portion 251c extends in the +y direction from a part of the strip portion 251a and is connected to the wire bonding portion 232 from the −y direction. The branch portion 251c overlaps the wire bonding portion 232 in the x direction. The branch portion 251d extends in the +y direction from a part of the strip portion 251a and is connected to the edge of the die pad portion 222 in the −y direction. The branch portion 251d overlaps the die pad portion 222 in the x direction. The branch portion 251e extends in the +y direction from a part of the strip portion 251a and is connected to the edge of the wire bonding portion 234 in the −y direction. The branch portion 251e overlaps the wire bonding portion 234 in the x direction.

The connection wiring 252 connects the wire bonding portion 235 and the quarter annular wiring 242. The connection wiring 252 has a strip shape extending in the +y direction from the quarter annular wiring 242. The connection wiring 252 connected to the wire bonding portion 235 is biased to the edge of the substrate main surface 110 in the −x direction.

The back surface electrodes 271, 272, 273 and 274 are formed in a portion of the substrate back surface 130 of the module substrate 100. Each of the back surface electrodes 271 to 274 is used as a bonding portion when the LED module A1 is mounted on a mounting board B or the like. The back surface electrodes 271 to 274 are isolated from each other in the x direction.

The through electrodes 281 and 282 are formed inside of the through-holes 141 and 142, respectively, and have a columnar shape. The through electrodes 281 and 282 are formed by filling the through-holes 141 and 142 with a conductive material, respectively. Both the through electrodes 281 and 282 extend from the substrate main surface 110 to the substrate back surface 130. The through electrodes 281 and 282 may have a cylindrical shape formed in the inner surface of the through-holes 141 and 142, respectively. In this case, the insides of the through-electrodes 281 and 282 may be filled with resin. The through electrode 281 overlaps the circular wiring 243 and the back surface electrode 272 when viewed from the z direction. The through electrode 281 is connected to the circular wiring 243 at the substrate main surface 110 side and is connected to the back surface electrode 272 at the substrate back surface 130. The through electrode 282 overlaps the circular wiring 244 and the back surface electrode 273 when viewed from the z direction. The through electrode 282 is connected to the circular wiring 244 at the substrate main surface 110 side and is connected to the back surface electrode 273 at the substrate back surface 130 side.

The corner groove electrodes 283 and 284 are formed so as to cover the inner surfaces of the corner grooves 151 and 152 of the module substrate 100, respectively. The corner groove electrodes 283 and 284 extend from the substrate main surface 110 to the substrate back surface 130. In addition, the corner grooves 151 and 152 in which the corner groove electrodes 283 and 284 may be formed may be filled with resin or the like. The edge of the corner groove electrode 283 in the +z direction is connected to the quarter annular wiring 241, and the edge thereof in the −z direction is connected to the back surface electrode 271. The edge of the corner groove electrode 284 in the +z direction is connected to the quarter annular wiring 242, and the edge thereof in the −z direction is connected to the back surface electrode 274.

In the wiring pattern 200 according to this embodiment, the back surface electrode 271 is electrically connected to the quarter annular wiring 241, the connection wiring 251, the die pad portions 221 to 223, and the wire bonding portions 232 and 234 via the corner groove electrode 283. Further, the back surface electrode 272 is electrically connected to the circular wiring 243 and the wire bonding portion 231 via the through electrode 281. The back surface electrode 273 is electrically connected to the circular wiring 244 and the wire bonding portion 233 via the through electrode 282. The back surface electrode 274 is electrically connected to the quarter annular wiring 242, the connection wiring 252, and the wire bonding portion 235 via the corner groove electrode 284.

The LED chips 301, 302 and 303, which serve as light sources of the LED module A1, are respectively bonded to predetermined positions on the die pad portions 221, 222 and 223 by the die bonding process. The LED chips 301 to 303 are arranged side by side in the x direction. All of the LED chips 301, 302 and 303 have a rectangular shape (substantially a square shape in this embodiment) when viewed from the z direction. In this embodiment, the LED chip 301 emits blue light, the LED chip 302 emits green light, and the LED chip 303 emits red light. When all of the LED chips 301 to 303 are caused to emit light, the LED module A1 emits white light. Further, in this embodiment, each of the LED chips 301 and 302 is a so-called two-wire type LED chip having two electrodes on its surface in the +z direction. The LED chip 303 is a so-called one-wire type LED chip having one electrode on its surface in the +z direction and a bottom electrode on its surface in the −z direction. The LED chips 301 and 302 correspond to a "first LED chip" recited in the claims, and the LED chips 303 correspond to a "second LED chip" recited in the claims.

Figure 5:
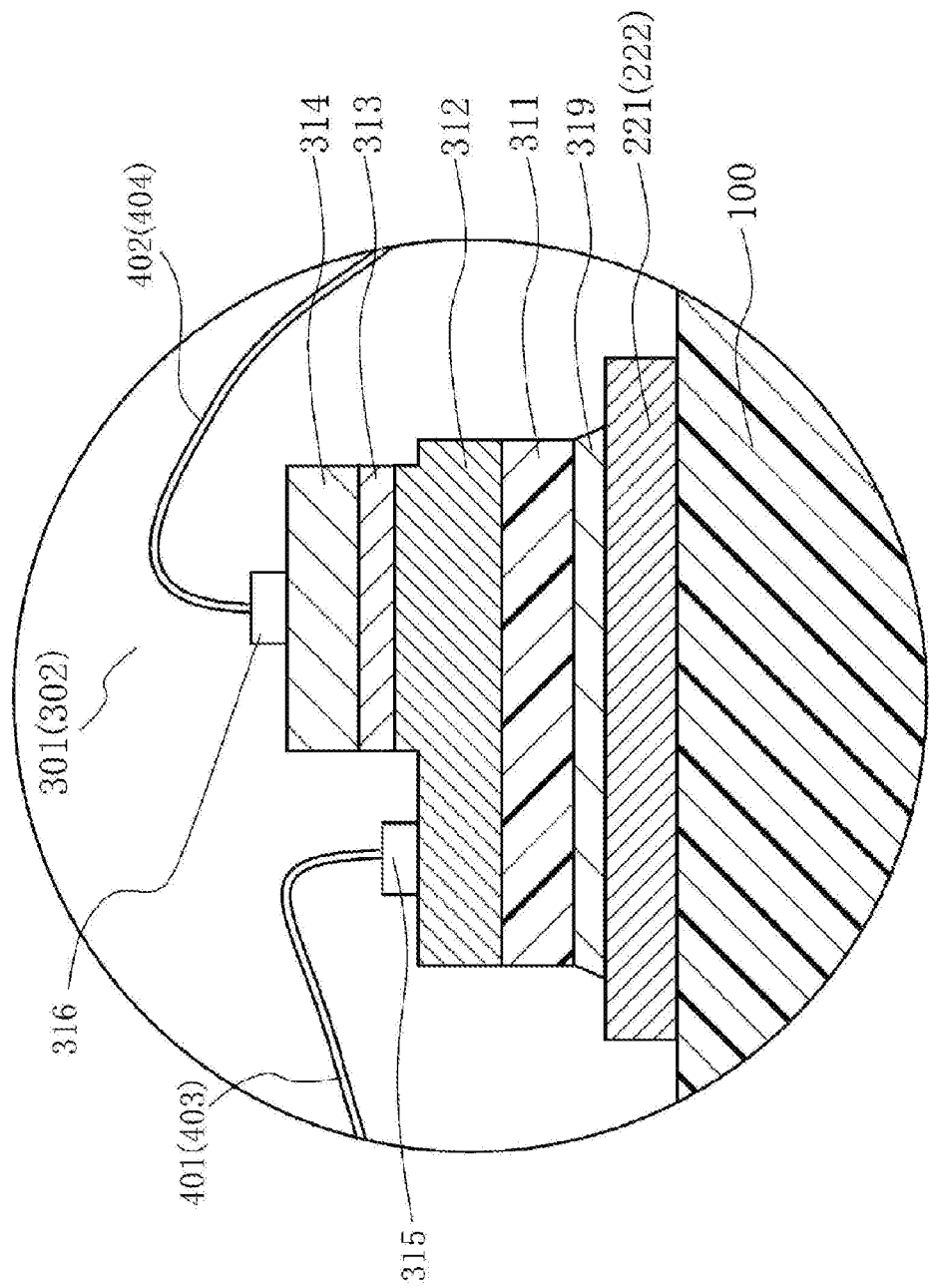
FIG. 5 is a sectional view of an LED chip (of a two-wire type).
Figure 6:
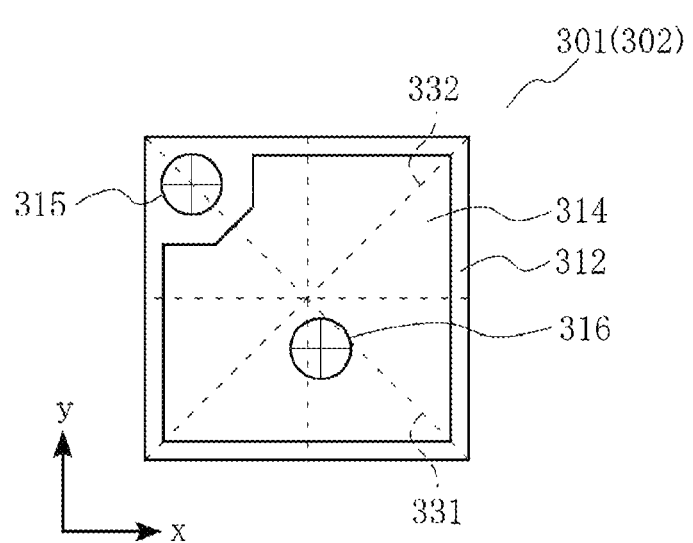
FIG. 6 is a plan view of the LED chip of FIG. 5.

FIGS. 5 and 6 are views for explaining the structure of the LED chip 301 (302). FIG. 5 is an enlarged sectional view of a main part of the LED chip 301 (302). FIG. 6 is a plan view of a single LED chip 301 (302).

As shown in FIG. 5, the LED chip 301 (302) includes a semiconductor substrate 311, an n-type semiconductor layer 312, an active layer 313, a p-type semiconductor layer 314, an n side electrode pad 315, and a p side electrode pad 316.

The semiconductor substrate 311 is formed of, e.g., a sapphire ($Al_2O_3$) substrate, a silicon (Si) substrate, a silicon carbide (SiC) substrate or the like. The n-type semiconductor layer 312, the active layer 313, and the p-type semiconductor layer 314 are stacked on the semiconductor substrate 311 (in the +z direction side of the semiconductor substrate 311) in this order. The surface of the n-type semiconductor layer 312 facing the +z direction is located in the −z direction side of the surface of the p-type semiconductor layer 314 facing the +z direction. As shown in FIG. 5, the n-type semiconductor layer 312 is larger than the p-type semiconductor layer 314 when viewed from the z direction. The n side electrode pad 315 for wire bonding is installed in the surface of the n-type semiconductor layer 312 facing the z direction and is exposed in the −x direction and the +z direction. The n side electrode pad 315 corresponds to a cathode of the LED chip 301 (302). The p side electrode pad 316 for wire bonding is installed in the surface of the p-type semiconductor layer 314 facing the z direction. The p side electrode pad 316 corresponds to an anode of the LED chip 301 (302).

In this embodiment, as shown in FIG. 6, the n side electrode pad 315 is disposed at one end side of a diagonal line 331 of the LED chip 301 (302) when viewed from the z direction. The diagonal line 331 corresponds to a "diagonal line" recited in the claims. The p side electrode pad 316 is disposed at a side opposite to the n side electrode pad 315 from the diagonal line 332 of the LED chip 301 (302). The p side electrode pad 316 is disposed in the vicinity of the center position of the LED chip 301 (302) in the z direction. When viewed from the z direction, a distance between the p side electrode pad 316 and the center position of the LED chip 301 (302) is shorter than a distance between the n side electrode pad 315 and the center position of the LED chip 301 (302). Therefore, then side electrode pad 315 is disposed closer to the outer edge of the LED chip 301 (302) than the p side electrode pad 316. The n side electrode pad 315 corresponds to a "first electrode pad" recited in the claims, and the p side electrode pad 316 corresponds to a "second electrode pad" recited in the claims.

The LED chip 301 (302) emits light by applying a forward bias voltage (a voltage at which the p side electrode pad 316 has a higher potential and then side electrode pad 315 has a lower potential). The luminescent color of the LED chip 301 (302) is determined by materials used for the semiconductor substrate 311, the n-type semiconductor layer 312, the active layer 313, and the p-type semiconductor layer 314. In this embodiment, these materials are selected so that the LED chip 301 emits blue light and the LED chip 302 emits green light.

In this embodiment, as shown in FIG. 5, the LED chip 301 (302) is bonded to the die pad portion 221 (222) formed on the module substrate 100 by a conductive paste 319 or possibly a resin paste. When a white or transparent resin paste or the like is used, the light emission intensity of the LED module A1 can be increased over a case where the conductive paste 319 is used.

Figure 7:
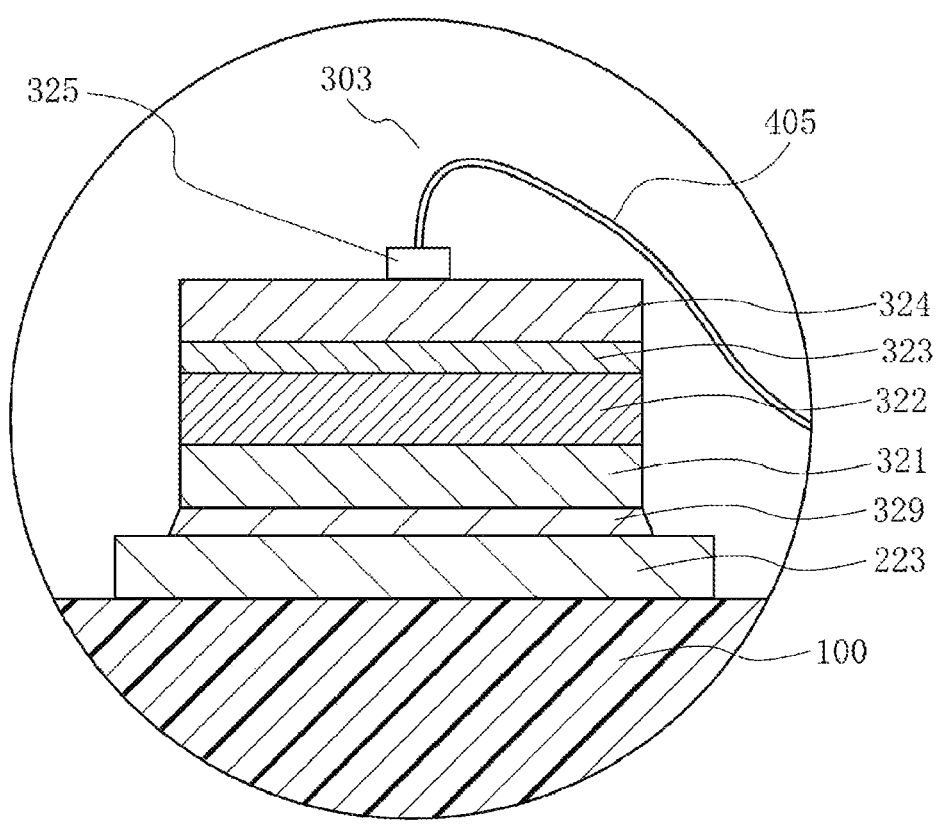
FIG. 7 is a sectional view of an LED chip (of a one-wire type).

FIG. 7 is a view for explaining the structure of the LED chip 303, which is an enlarged sectional view of a main part of the LED chip 303. As shown in FIG. 7, the LED chip 303 includes a bottom electrode 321, a p-type semiconductor layer 322, an active layer 323, an n-type semiconductor layer 324, and a wire electrode pad 325.

The bottom electrode 321 is disposed at the bottom (the −z direction) side of the LED chip 303 and is conductively bonded to the wiring pattern 200 (the die pad portion 223) by a conductive paste 329 or the like. In this embodiment, the p-type semiconductor layer 322, the active layer 323, and the n-type semiconductor layer 324 are stacked on the bottom electrode 321 (in the +z direction side of the bottom electrode 321) in this order. The wire electrode pad 325 for wire bonding is installed in the surface of the n-type semiconductor layer 324 facing the +z direction. The wire electrode pad 325 is disposed at the center position of the LED chip 303 when viewed from the z direction (not shown). The bottom electrode 321 corresponds to an anode of the LED chip 303, and the wire electrode pad 325 corresponds to a cathode of the LED chip 303.

The LED chip 303 emits light by applying a forward bias voltage (a voltage at which the bottom electrode 321 has a higher potential and the wire electrode pad 325 has a lower potential). The luminescent color of the LED chip 303 is determined by materials used for the p-type semiconductor layer 322, the active layer 323, and the n-type semiconductor layer 324. In this embodiment, these materials are selected so that the luminescent color of the LED chip 303 becomes the above-described luminescent color (red).

In this embodiment, as shown in FIG. 7, the LED chip 303 is bonded to the die pad portion 223 formed on the module substrate 100 by the conductive paste 329. The conductive paste 329 is made of the same material as the conductive paste 319. Thus, all of the LED chips 301 to 303 can be bonded using a paste agent of the same material. Therefore, it is not necessary to change the paste agent for each of the LED chips 301 to 303, which can simplify the die bonding process.

The wires 401, 402, 403, 404 and 405 are used to make electrical conduction between the LED chips 301, 302 and 303 and the wiring pattern 200. Each of the wires 401 to 405 is made of, e.g., metal such as Au and is bonded by the above-described wire bonding process. The wires 401 and 403 correspond to a "first wire" recited in the claims, the wires 402 and 404 correspond to a "second wire" recited in the claims, and the wire 405 corresponds to a "third wire" recited in the claims.

One end of the wire 401 is bonded to the n side electrode pad 315 of the LED chip 301, and the other end is bonded to the wire bonding portion 231. Therefore, the wire 401 makes electrical conduction between the wire bonding portion 231 and the n side electrode pad 315 of the LED chip 301. In this embodiment, as described above, since the wire bonding portion 231 and the back surface electrode 272 are in electrical conduction, the n side electrode pad 315 of the LED chip 301 is in electrical conduction with the back surface electrode 272.

One end of the wire 402 is bonded to the p side electrode pad 316 of the LED chip 301, and the other end is bonded to the wire bonding portion 232. Therefore, the wire 402 makes electrical conduction between the wire bonding portion 232 and the p side electrode pad 316 of the LED chip 301. In this embodiment, as described above, since the wire bonding portion 232 and the back surface electrode 271 are in electrical conduction, the p side electrode pad 316 of the LED chip 301 is in electrical conduction with the back surface electrode 271.

One end of the wire 403 is bonded to then side electrode pad 315 of the LED chip 302, and the other end is bonded to the wire bonding portion 233. Therefore, the wire 403 makes electrical conduction between the wire bonding portion 233 and the n side electrode pad 315 of the LED chip 302. In this embodiment, as described above, since the wire bonding portion 233 and the back surface electrode 273 are in electrical conduction, then side electrode pad 315 of the LED chip 302 is in electrical conduction with the back surface electrode 273.

One end of the wire 404 is bonded to the p side electrode pad 316 of the LED chip 302, and the other end is bonded to the wire bonding portion 234. Therefore, the wire 404 makes electrical conduction between the wire bonding portion 234 and the p side electrode pad 316 of the LED chip 302. In this embodiment, as described above, since the wire bonding portion 234 and the back surface electrode 271 are in electrical conduction, the p side electrode pad 316 of the LED chip 302 is in electrical conduction with the back surface electrode 271.

One end of the wire 405 is bonded to the wire electrode pad 325 of the LED chip 303, and the other end is bonded to the wire bonding portion 235. Therefore, the wire 405 makes electrical conduction between the wire bonding portion 235 and the wire electrode pad 325 of the LED chip 303. In this embodiment, as described above, since the wire bonding portion 235 and the back surface electrode 274 are in electrical conduction, the wire electrode pad 325 of the LED chip 303 is in electrical conduction with the back surface electrode 274.

Figure 8:
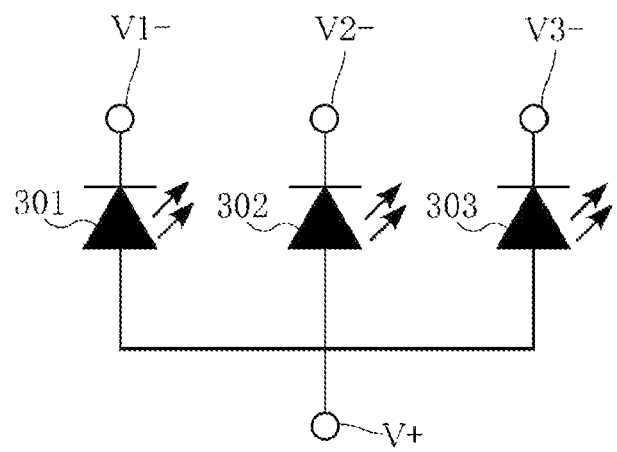
FIG. 8 is a circuit diagram of an LED module according to a first embodiment of the present disclosure.

The LED chips 301 to 303 are connected by the wiring pattern 200 and the wires 401 to 405 configured as above and, as a result, the LED module A1 has a circuit configuration shown in FIG. 8. As shown in FIG. 8, in the LED module A1, the anodes of the LED chips 301 to 303 are connected in common to one positive electrode terminal V+. The cathodes of the LED chips 301 to 303 are connected to negative electrode terminals V1−, V2− and V3−, respectively. The positive electrode terminal V corresponds to the back surface electrode 271 and the negative electrode terminals V1−, V2− and V3− correspond to the back surface electrodes 272, 273 and 274, respectively.

The insulating film 500 is formed on the module substrate 100 and covers a portion of the wiring pattern 200. The insulating film 500 is a resist layer and is called a solder resist. In this embodiment, the insulating film 500 includes a main surface insulating film 510 and a back surface insulating film 520. The insulating film may include a side surface insulating film covering all or portions of the substrate side surfaces 121 to 124.

The main surface insulating film 510 is formed in a portion of the substrate main surface 110 and covers a portion of the main surface electrode 210. In this embodiment, the main surface insulating film 510 is disposed at both ends in the x direction and the y direction. Further, the main surface insulating film 510 is not disposed on the die pad portions 221 to 223 and the wire bonding portions 231 to 235.

The back surface insulating film 520 is formed in a portion of the substrate back surface 130 and covers portions of the back surface electrodes 271 to 274. In this embodiment, the back surface insulating film 520 has a rectangular shape extending in the x direction when viewed from the z direction. In addition, the back surface insulating film 520 is disposed at the end side in the −y direction.

The housing 600 is made of, e.g., white resin such as a liquid crystal polymer and is disposed on the substrate main surface 110. The housing 600 has a frame shape surrounding the LED chips 301 to 303. The housing 600 is inclined from the −z direction toward the +z direction so that its section perpendicular to the z direction becomes large. The inner surface 610 of the housing 600 functions as a reflector that reflects light from the LED chips 301 to 303 to emit the light. The housing 600 is bonded with an adhesive (not shown) or the like. The housing 600 may be insert-molded using a metal mold or the like. Further, a lens for irradiating light from the LED module A1 in a predetermined direction may be provided on the housing 600.

The housing 600 is filled with the sealing resin 700 to cover the LED chips 301 to 303 and the wires 401 to 405. The sealing resin 700 is made of a material that transmits light from the LED chips 301 to 303, such as a transparent or translucent silicone resin or an epoxy resin. The sealing resin 700 may include a fluorescent material that emits light of different wavelengths when excited by light from the LED chips 301 to 303.

Next, detailed configuration of the die pad portions 221 and 222 will be described. Hereinafter, the die pad portion 221 will be described, but since the die pad portion 222 has the same structure as the die pad portion 221, explanation of which will not be repeated.

The main pad portion 221a has a rectangular shape. The shape of the main pad portion 221a is analogous to that of the LED chip 301. Therefore, in this embodiment, since the LED chip 301 has substantially a square shape, the main pad portion 221a also has substantially a square shape. In this embodiment, the main pad portion 221a is formed larger than the LED chip 301 when viewed from the z direction. However, since a difference in size between the main pad portion 221a and the LED chip 301 is smaller than the amount of misalignment (in maximum) during die bonding, when misalignment occurs during the die bonding, there is a possibility that the LED chip 301 protrudes beyond the main pad portion 221a.

The auxiliary pad portion 221b is formed integrally with the main pad portion 221a. The auxiliary pad portion 221b is a portion protruding from the main pad portion 221a in a direction from the center position of the LED chip 301 to the position of the n side electrode pad 315 when viewed from the z direction. In this embodiment, the auxiliary pad portion 221b has an L shape.

Figure 9A:
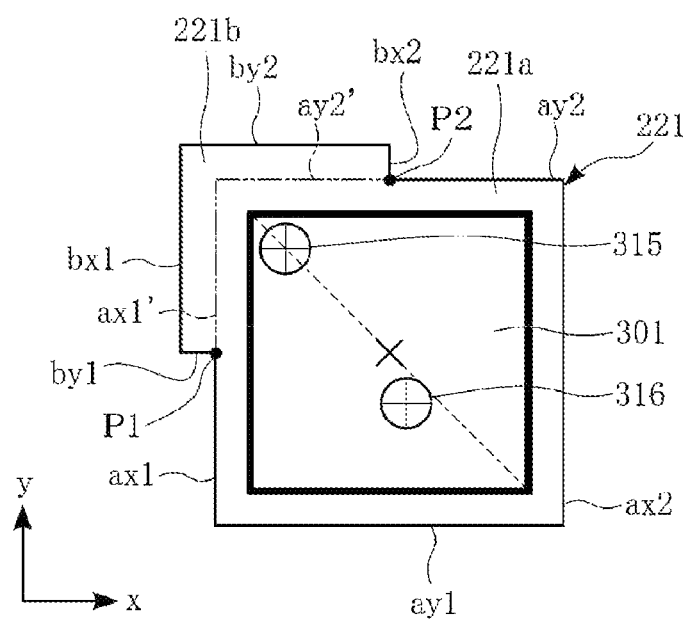
FIGS. 9A and 9B are views illustrating a die pad portion according to the first embodiment of the present disclosure.
Figure 9B:
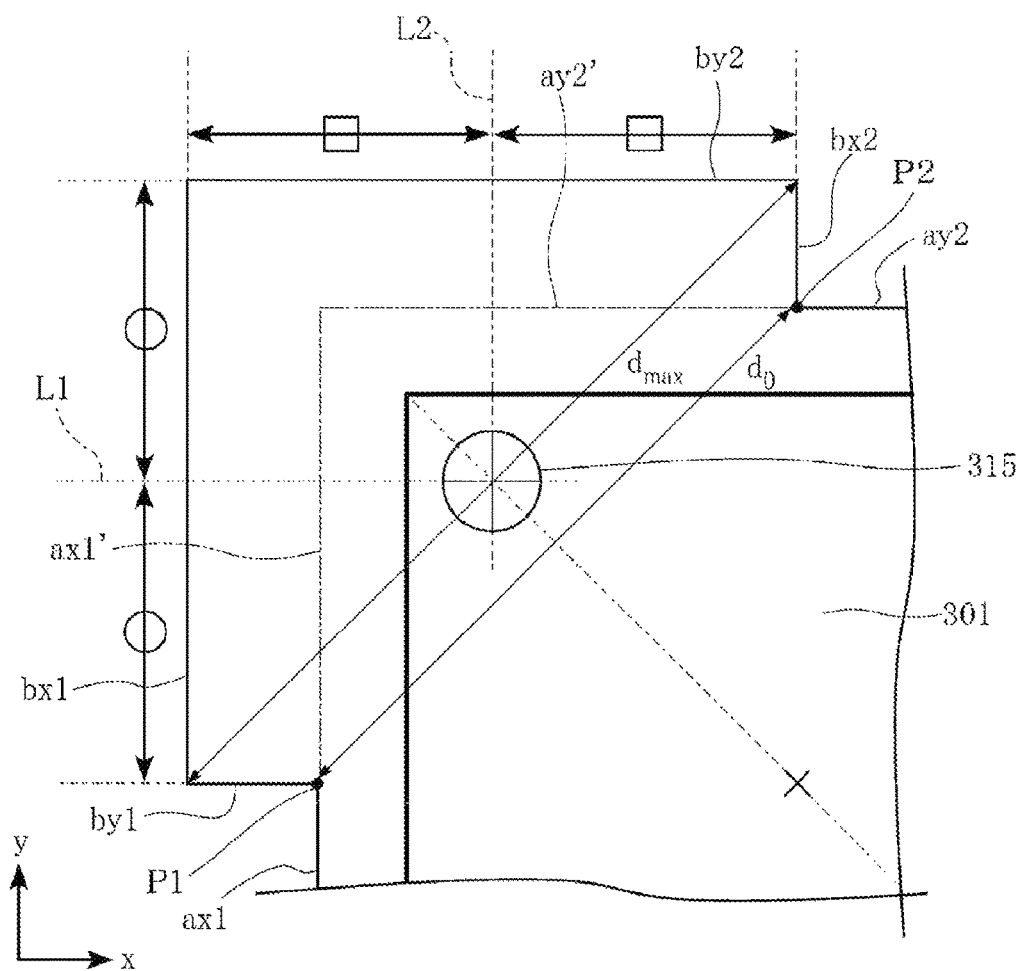

FIGS. 9A and 9B are views for explaining the main pad portion 221a and the auxiliary pad portion 221b. FIG. 9A is a view illustrating the entire main pad portion 221a and the auxiliary pad portion 221b. For convenience of understanding, the LED chip 301 is also shown. The connection wiring 251 (the branch portion 251b) and the wires 401 and 402 are not shown. FIG. 9B is a partially-enlarged view of FIG. 9A. In FIGS. 9A and 9B, the LED chip 301 is die-bonded to a preset position in the die pad portion 221 without misalignment. The outline of the main pad portion 221a is indicated by a two-dot chain line.

As shown in FIG. 9A, the main pad portion 221a has four sides ax1, ax2, ay1, and ay2, which form the outer edge of the main pad portion 221a. The side ax1 is a side extending in the y direction on the −x direction side. The side ax2 is a side extending in the y direction on the +x direction side. The side ay1 is a side extending in the x direction on the −y direction side. The side ay2 is a side extending in the x direction on the +y direction side. Further, auxiliary lines ax1' and ay2' indicated by two-dot chain lines indicate a boundary between the main pad portion 221a and the auxiliary pad portion 221b. Although the auxiliary lines ax1' and ay2' are shown in FIG. 9A for convenience of understanding, the main pad portion 221a and the auxiliary pad portion 221b are integrally formed and the auxiliary lines ax1' and ay2' do not exist in appearance. The auxiliary line ax1' is on the extension of the side ax1 and the auxiliary line ay2' is on the extension of the side ay2. Therefore, the main pad portion 221a is a portion surrounded by the four sides ax, ax2, ay1, and ay2 and the two auxiliary lines ax1' and ay2' and has a rectangular shape as described above.

The auxiliary pad portion 221b has four sides bx1, bx2, by1, and by2, which form the outer edge of the auxiliary pad portion 221b. The side bx1 is a side extending in the y direction on the −x direction side. The side bx2 is a side extending in the y direction on the +x direction side. The side bx1 and the side bx2 are in parallel. The side by1 is a side extending in the x direction on the −y direction side. The side by2 is a side extending in the x direction on the +y direction side. The side by1 and the side by2 are in parallel.

The outer edge of the main pad portion 221a and the outer edge of the auxiliary pad portion 221b intersect at connection points P1 and P2. The connection point P1 is the intersection of the side ax1 and the side by1 and the connection point P2 is the intersection of the side ay2 and the side bx2. The connection point P1 corresponds to a "first connection point" recited in the claims, and the connection point P2 corresponds to a "second connection point" recited in the claims. The side by1 extends in the −x direction perpendicularly to the side ax1 from the connection point P1. The side bx1 extends in the +y direction from the end portion of the side by1 in the opposite side to the connection point P1. The side bx1 is parallel to the side ax1. The side bx2 extends in the +y direction perpendicularly to the side ay2 from the connection point P2. The side by2 extends in the −x direction from the end portion of the side bx2 in the opposite side to the connection point P2. The side by2 is parallel to the side ay2. The side bx1 and the side by2 intersect perpendicularly. The sides by1, bx2, bx1, and by2 correspond to a "first side," "second side," "third side," and "fourth side" recited in the claims, respectively.

In this embodiment, when the LED chip 301 is die-bonded to the preset position in the main pad portion 221a without misalignment, the n side electrode pad 315 of the LED chip 301 is positioned at an intersection of the perpendicular bisector L1 of the side bx1 and the perpendicular bisector L2 of the side by2, as shown in FIG. 9B.

Further, as shown in FIG. 9B, the maximum dimension $d_{max}$ of the auxiliary pad portion 221b in the direction in which the two connection points P1 and P2 are separated from each other is larger than a distance $d_0$ between the two connection points P1 and P2.

Specifically, the amount of protrusion of the auxiliary pad portion 221b may be appropriately set according to the mounting accuracy (accuracy with respect to misalignment) of a die bonder that performs die bonding. That is, when the mounting accuracy is low, since the amount of misalignment from a predetermined position in the main pad portion 221a increases in then die bonding process of the LED chip 301, the auxiliary pad portion 221b may be widened. Conversely, when the mounting accuracy is high, since the amount of misalignment from the predetermined position in the main pad portion 221a decreases in the die bonding process of the LED chip 301, the auxiliary pad portion 221b may be narrowed.

Figure 10A:
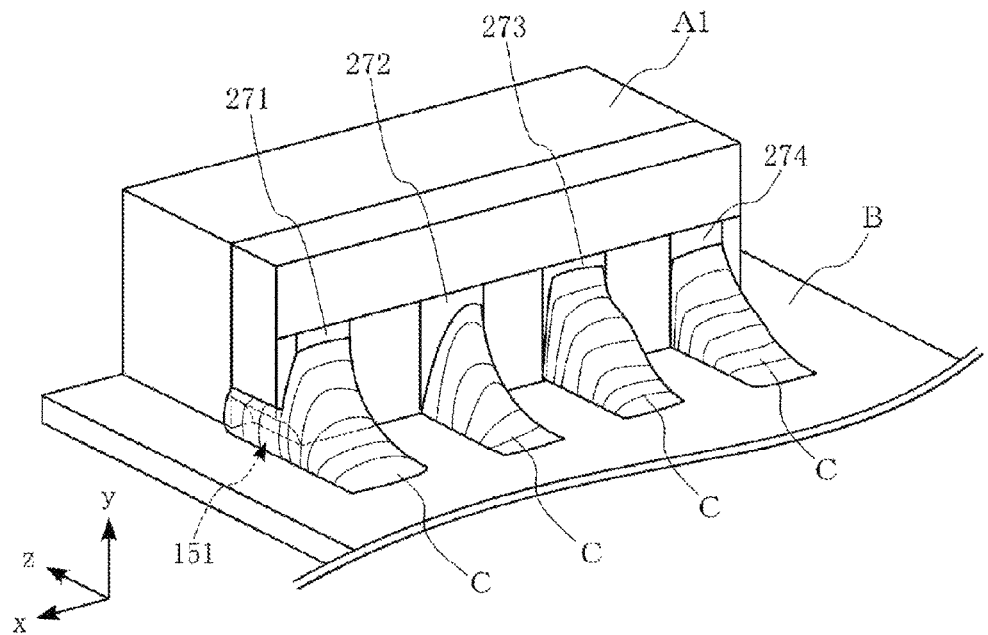
FIGS. 10A and 10B are views illustrating a mounting structure of the LED module according to the first embodiment of the present disclosure.
Figure 10B:
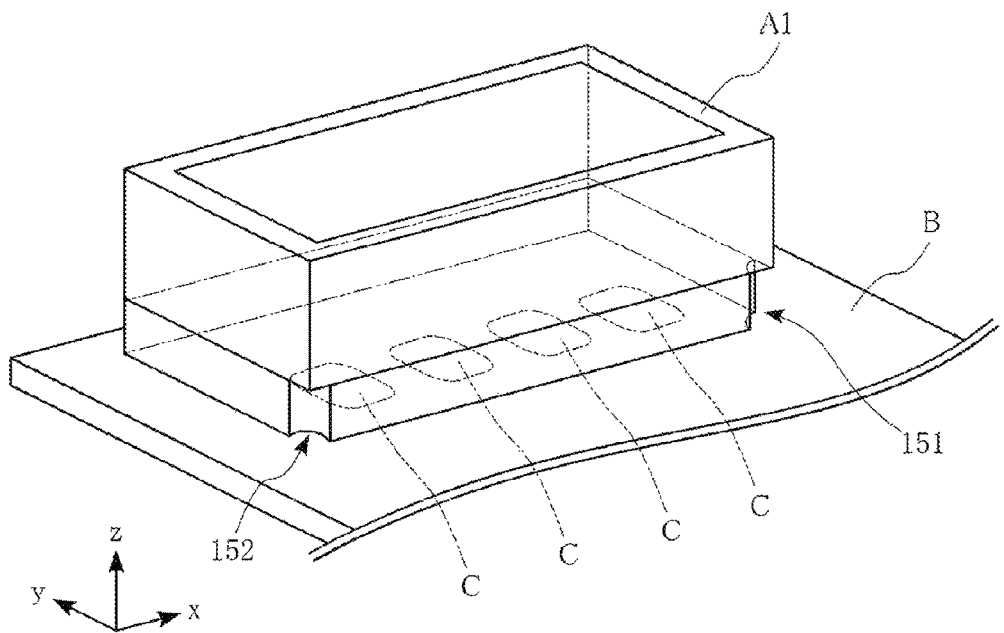

FIGS. 10A and 10B illustrate a mounting structure of the LED module A1 according to this embodiment. In FIGS. 10A and 10B, the mounting structure of the LED module A1 includes the LED module A1, a mounting board B, and a solder C. FIG. 10A shows a case where the LED module A1 is mounted as a side view type, and FIG. 10B shows a case where the LED module A1 is mounted as a top view type. Therefore, the LED module A1 according to the present disclosure may be mounted as either a side view type or a top view type. As used herein, the top view type refers to emitting light in a direction in which the mounting surface of the mounting board B faces and the side view type refers to emitting light in a direction perpendicular to the direction in which the mounting surface of the mounting board B faces.

The mounting board B is, for example, a printed circuit board. The mounting board B includes, for example, an insulating substrate and a pattern electrode (not shown) formed on the insulating substrate. The LED module A1 is mounted on the mounting board B. The solder C bonds the LED module A1 and the mounting board B together.

In FIG. 10A, the substrate side surface 124 faces the mounting board B. The solder C is in contact with the back surface electrodes 271 to 274 and the pattern electrode of the mounting board B. In FIG. 10B, the substrate back surface 130 faces the mounting board B. The solder C is in contact with the back surface electrodes 271 to 274 and the pattern electrode of the mounting board B. In this embodiment, the dimension of the LED module A1 in the x direction and the y direction are, for example, about 2.9 mm×1.0 mm. In FIG. 10A, the corner grooves 151 and 152 are filled with the solder C to increase the bonding strength between the LED module A1 and the mounting board B. However, the corner grooves 151 and 152 may not be filled with the solder C.

Next, the operation of the LED module A1 according to this embodiment will be described.

According to this embodiment, the auxiliary pad portion 221b (222b) has a shape protruding from the main pad portion 221a (222b) in a direction toward the position of the n side electrode pad 315 of the LED chip 301 (302) from the center position of the LED chip 301 (302). In consideration of misalignment during the die bonding, a conventional die pad portion has a shape which is uniformly enlarged from the outer shape of the LED chip 301 (302) in all of the four directions when viewed from the z direction. Therefore, since the size of the die pad portion 221 (222) is smaller than that of the conventional die pad portion in a plan view, the size of the LED module A1 can be reduced.

Figure 11A:
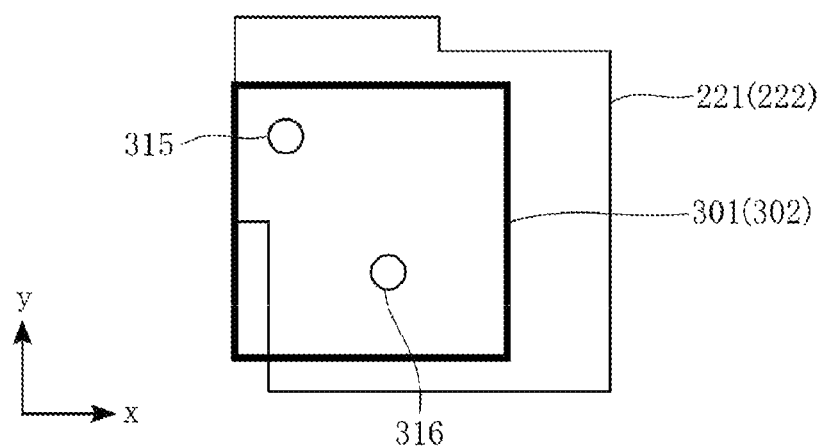
FIGS. 11A to 11C are views for explaining the effect of the LED module according to the first embodiment of the present disclosure.
Figure 11B:
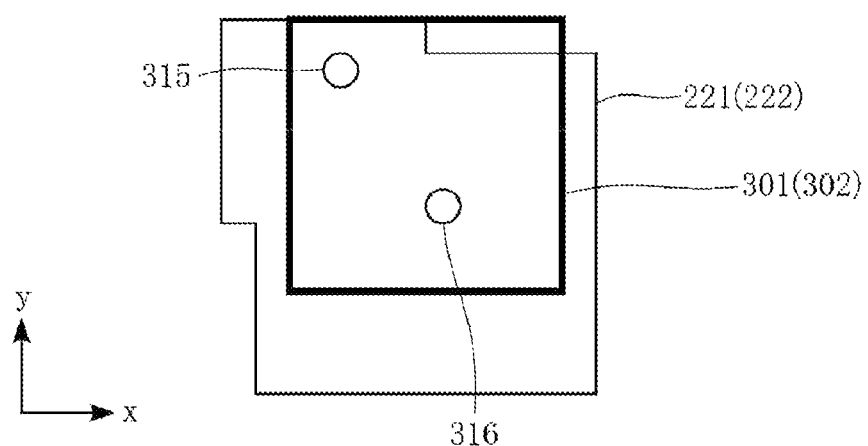
Figure 11C:
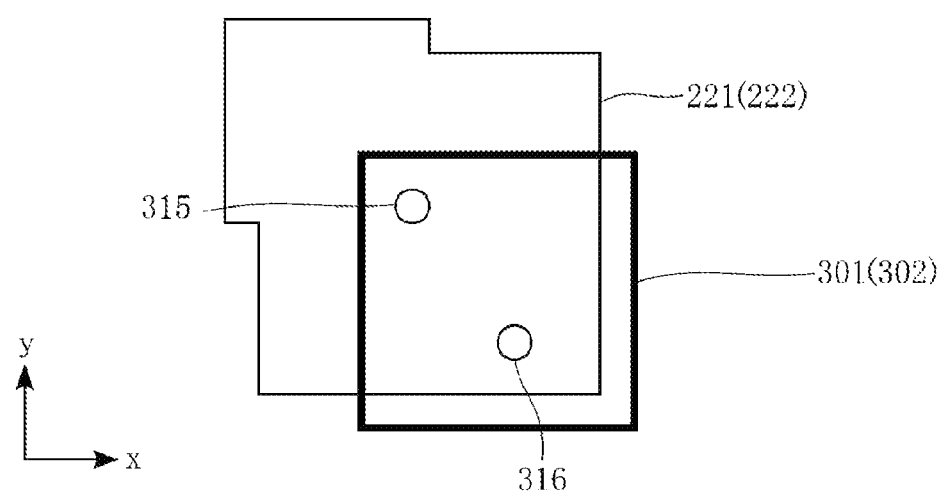

In addition, as described above, since the auxiliary pad portion 221b (222b) has a shape protruding from the main pad portion 221a (222a), even when misalignment occurs during the die bonding, the n side electrode pad 315 and the p side electrode pad 316 can be overlapped with the die pad portion 221 (222) when viewed from the z direction. Thus, even when wires are bonded to then side electrode pad 315 and the p side electrode pad 316 of the LED chips 301 and 302, it is possible to prevent the LED chips 301 and 302 from peeling off or being misaligned. For example, when the LED chip 301 is die-bonded, whatever misalignment such as a case of being misaligned in the −x direction (see FIG. 11A), a case of being misaligned in the +y direction (see FIG. 11B), and a case of being misaligned in the +x direction and the −y direction (see FIG. 11C) occurs, it is possible to place the die pad portion 221 below the n side electrode pad 315 and the p side electrode pad 316 when viewed from the z direction. In addition, a portion of the LED chip 301 (302) protruding from the die pad portion 221 (222) is directly bonded to the module substrate 100 by the conductive paste 319 bonding the LED chip 301 (302). Since the module substrate 100 has higher bondability than the wiring pattern 200, the bondability of the LED chip 301 (302) is enhanced.

In this embodiment, the LED module A1 is configured to have the circuit configuration shown in FIG. 8. Thus, it is possible to connect each of the LED chips 301 to 303 to a power supply, so that the LED chips 301 to 303 can be individually turned on. For example, by turning on the respective LED chips 301, 302 and 303, it is possible to emit blue light, green light and red light, respectively. Further, by turning on all of the LED chips 301, 302 and 303 simultaneously, it is possible to emit white light.

Figure 12A:
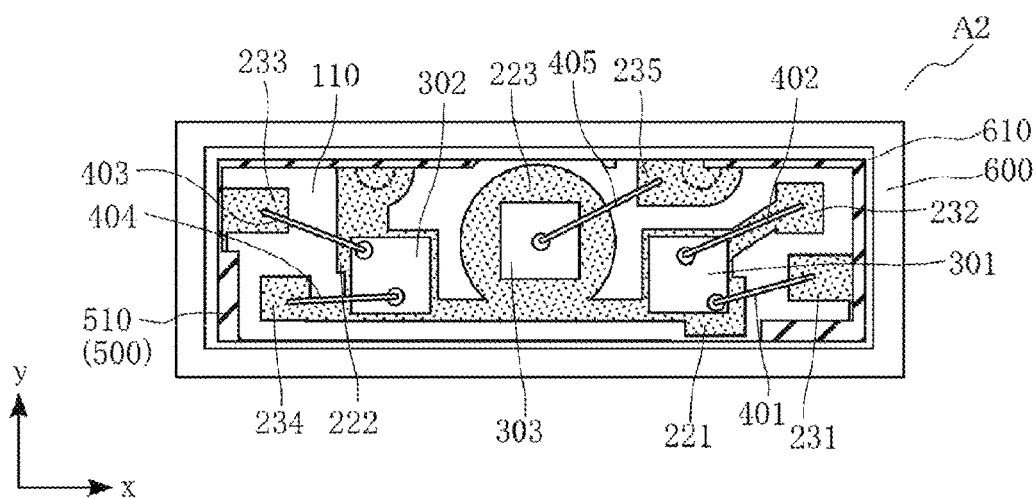
FIGS. 12A to 12C are plan views of a main part of an LED module according to a second embodiment of the present disclosure.
Figure 12B:
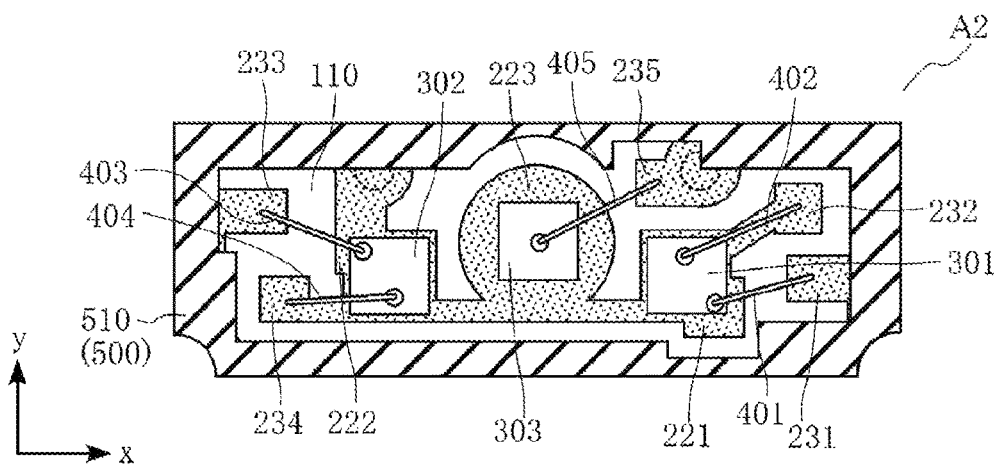
Figure 12C:
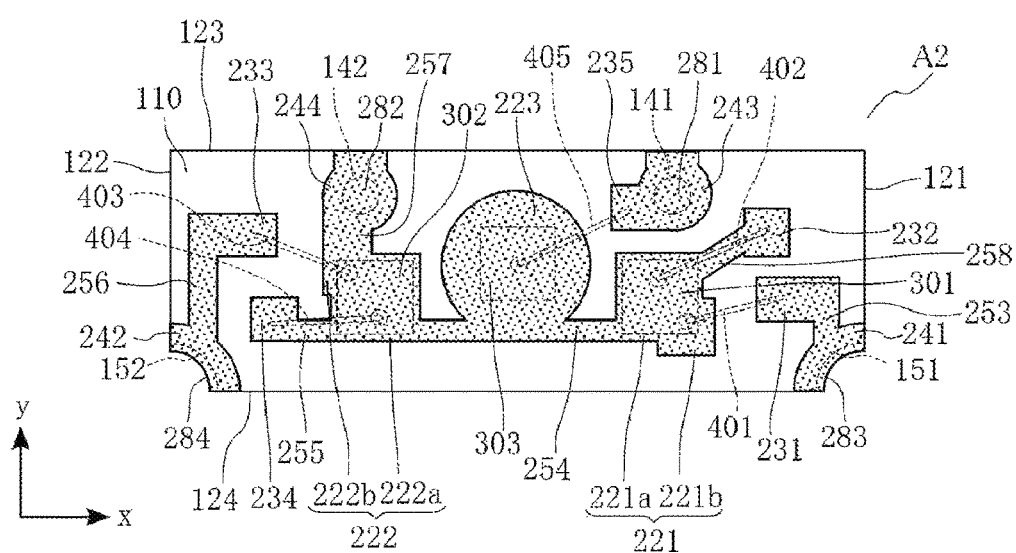
Figure 13:
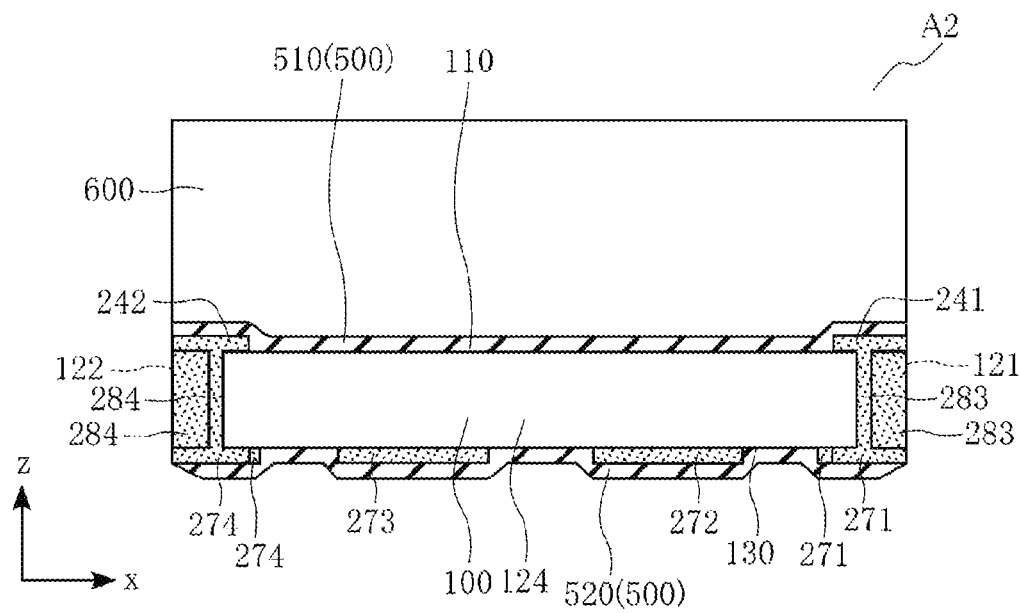
FIG. 13 is a side view of the LED module of FIGS. 12A to 12C.
Figure 14:
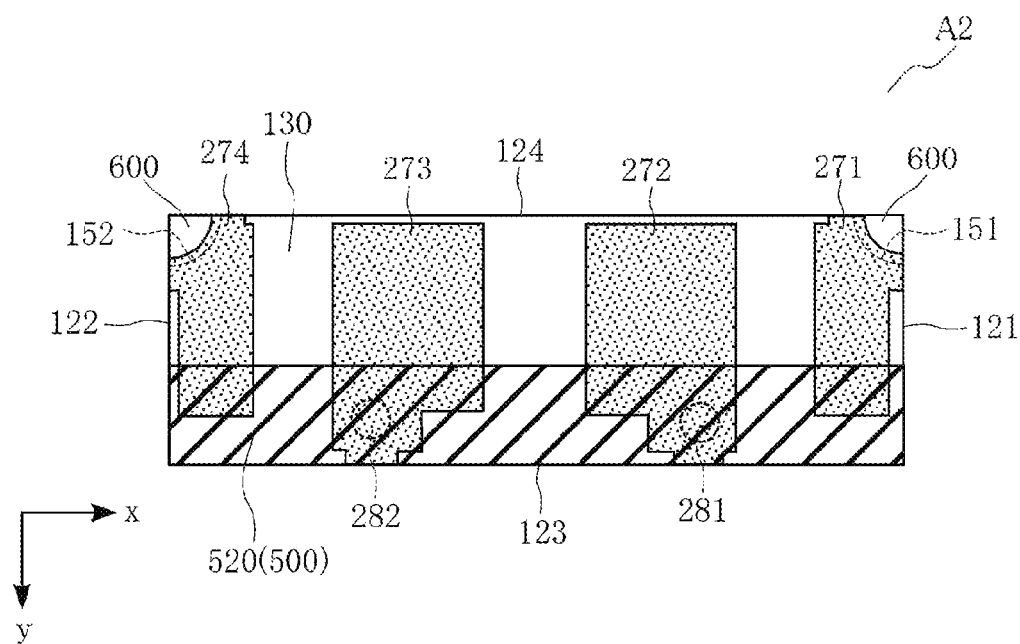
FIG. 14 is a bottom view of the LED module of FIGS. 12A to 12C.

FIGS. 12A to 14 are views illustrating an LED module A2 according to a second embodiment. The same or similar elements as those of the first embodiment are denoted by the same reference numerals, and explanation of which will not be repeated. FIGS. 12A to 12C are plan views of a main part of the LED module A2. FIGS. 12A to 12C correspond to FIGS. 1A to 1C of the first embodiment, respectively. FIG. 13 is a side view of the LED module A2. FIG. 14 is a bottom view of the LED module A2. For convenience of understanding, the wiring pattern 200 and the insulating film 500 are hatched in FIGS. 12A to 14. In addition, the insulating film 500 is shown in phantom in FIG. 14.

In the above-described LED module A1, the case where then side electrode pad 315 and the p side electrode pads 316 are arranged to face the same direction in both of the LED chips 301 and 302 has been assumed. However, in the LED module A2 according to this embodiment, then side electrode pad 315 and the p side electrode pad 316 are arranged to face different directions.

The LED module A2 according to this embodiment is different from the LED module A1 in the configuration of the wiring pattern 200. The main surface electrode 210 is formed in the substrate main surface 110 of the module substrate 100. In this embodiment, as shown in FIG. 12C, the main surface electrode 210 has three die pad portions 221 to 223, five wire bonding portions 231 to 235, two quarter annular wires 241 and 242, two circular wirings 243 and 244, and six connection wirings 253, 254, 256, 257 and 258.

The connection wiring 253 connects the wire bonding portion 231 and the quarter annular wiring 241. The connection wiring 253 has a strip shape extending in the +y direction from the quarter annular wiring 241 and is connected to the wire bonding portion 231.

The connection wiring 254 connects the die pad portions 221 and 222 and the die pad portion 223. The connection wiring 254 has a strip shape extending in the −x direction from a portion of the edge of the die pad portion 221 in the −x direction and is connected to a portion of the edge of the die pad portion 222 in the +x direction. Further, the center portion of the connection wiring 254 in the x direction is connected to the die pad portion 223.

The connection wiring 255 connects the die pad portion 222 and the wire bonding portion 234. The connection wiring 255 has a strip shape extending in the −x direction from a portion of the edge of the die pad portion 222 in the −x direction and is connected to a portion of the edge of the wire bonding portion 234 in the +x direction.

The connection wiring 256 connects the quarter annular wiring 242 and the wire bonding portion 233. The connection wiring 256 has a strip shape extending in the +y direction from the quarter annular wiring 242 and is connected to the wire bonding portion 233 in the x direction.

The connection wiring 257 connects the die pad portion 222 and the circular wiring 244. The connection wiring 257 extends in the +y direction from the die pad portion 222 and is connected to the circular wiring 244 in the y direction.

The connection wiring 258 connects the die pad portion 221 and the wire bonding portion 232. The connection wiring 258 extends obliquely (in the +x direction and the +y direction) from the end portion of the die pad portion 221 in the +x direction and the +y direction and is connected to the wire bonding portion 232.

In this embodiment, the wire bonding portion 235 is connected to the circular wiring 243 in the x direction.

In the wiring pattern 200 according to this embodiment, the back surface electrode 271 makes electrical conduction with the quarter annular wiring 241, the connection wiring 253, and the wire bonding portion 231 via the corner groove electrode 283. In addition, the back surface electrode 272 makes electrical conduction with the circular wiring 243 and the wire bonding portion 235 via the through electrode 281. The back surface electrode 273 makes electrical conduction with the circular wiring 244, the connection wirings 254, 255 and 257, the die pad portions 221 to 223, and the wire bonding portion 234 via the through electrode 282. In addition, the back surface electrode 274 makes electrical conduction with the quarter annular wiring 242, the connection wiring 256, and the wire bonding portion 233 via the corner groove electrode 284.

The LED chips 301 to 303 are connected by the wiring pattern 200 and the wires 401 to 405 configured as above and, as a result, the LED module A2 has the circuit configuration shown in FIG. 8, like the LED module A1. However, in this embodiment, the positive electrode terminal V+ corresponds to the back surface electrode 273 and the negative electrode terminals V1−, V2− and V3− correspond to the back surface electrodes 271, 274 and 272, respectively.

As with the LED module A1, the LED module A2 according to this embodiment is mounted on the mounting board B, as shown in FIGS. 10A and 10B. Therefore, the LED module A2 may also be mounted as either a side view type or a top view type.

The LED module A2 according to the second embodiment described above can achieve the same effects as the LED module A1 according to the first embodiment.

Figure 15A:
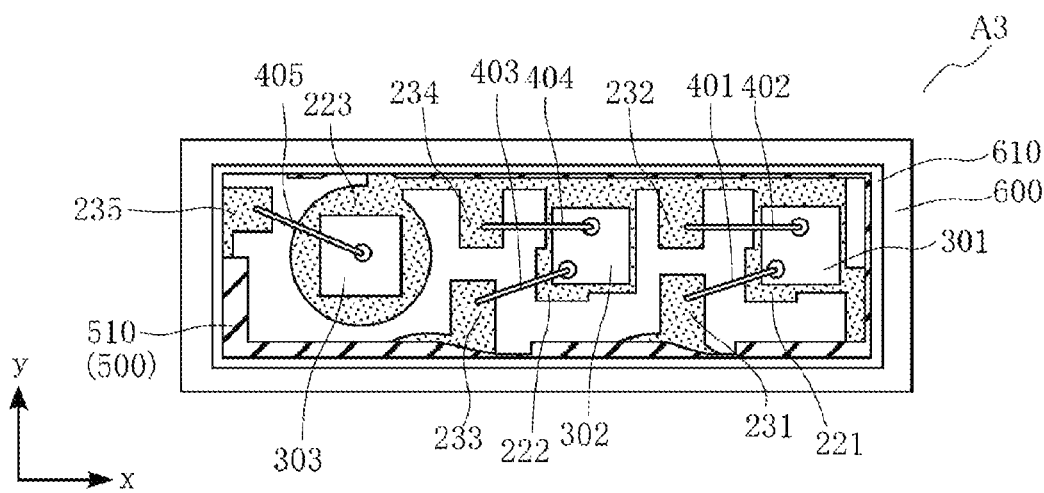
FIGS. 15A to 15C are plan views of a main part of an LED module according to a third embodiment of the present disclosure.
Figure 15B:
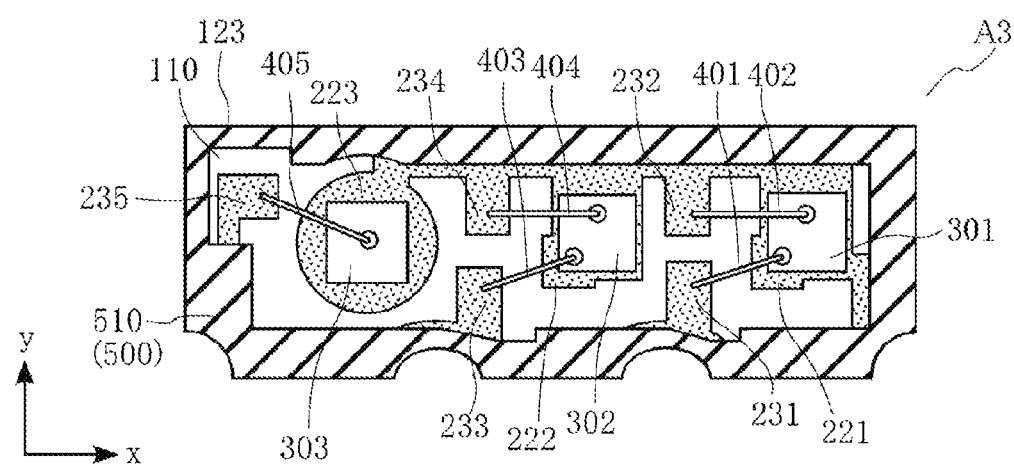
Figure 15C:
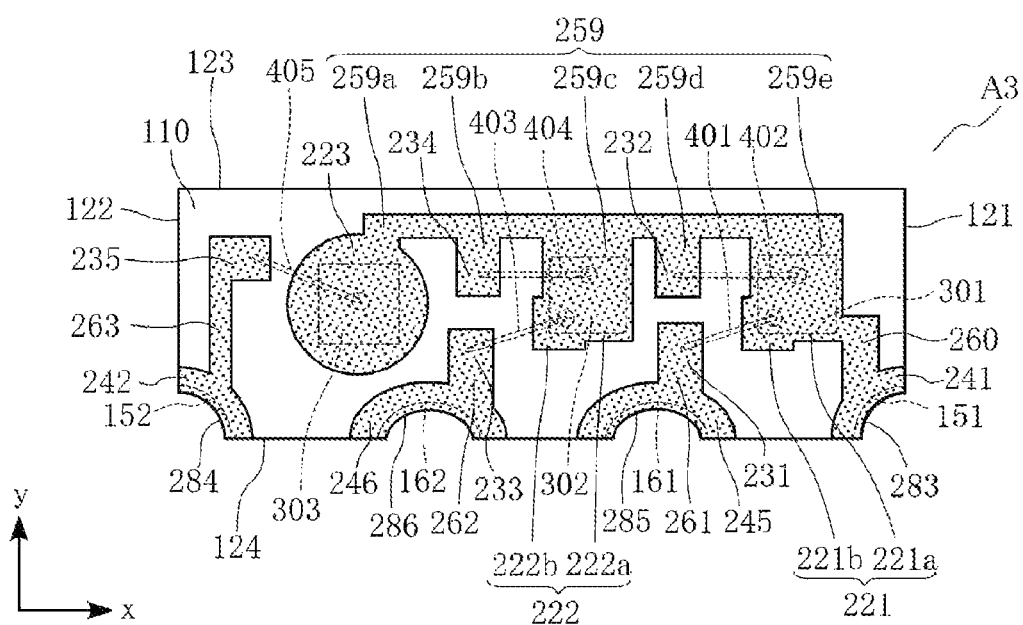
Figure 16:
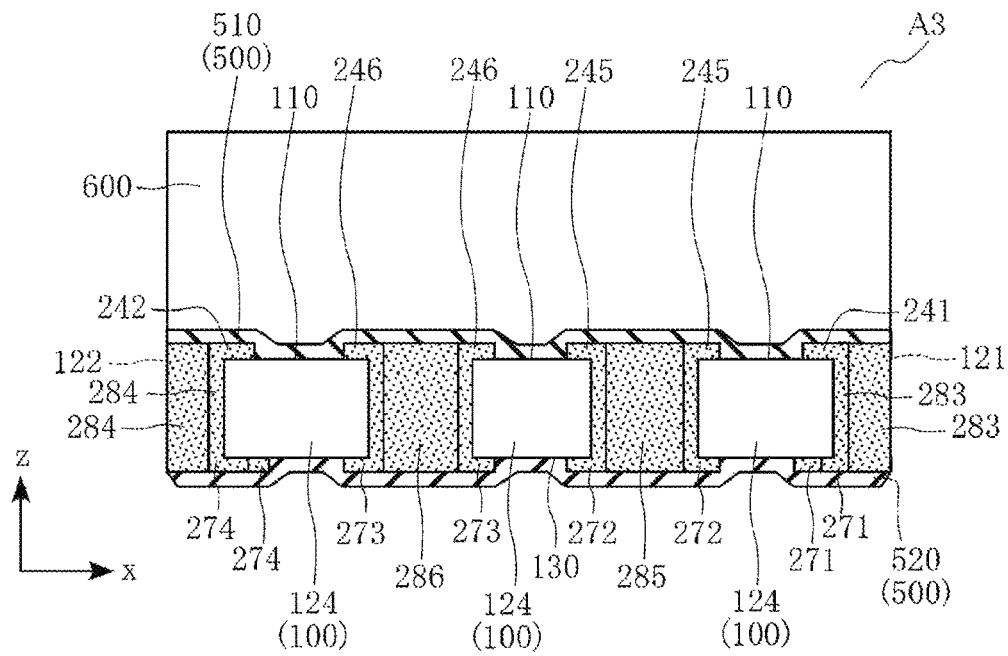
FIG. 16 is a side view of the LED module of FIGS. 15A to 15C.
Figure 17:
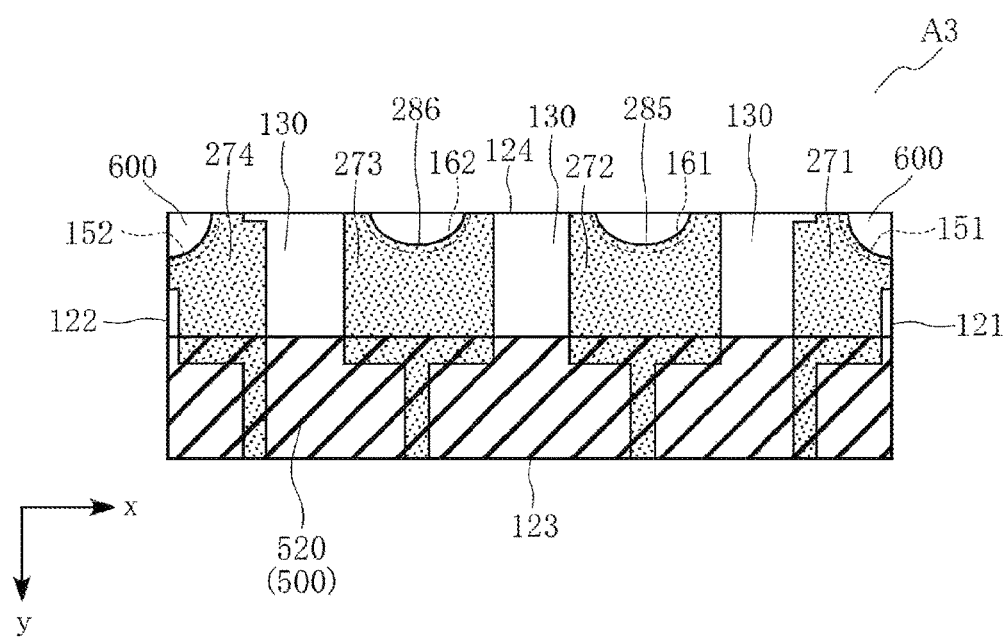
FIG. 17 is a bottom view of the LED module of FIGS. 15A to 15C.

FIGS. 15A to 17 are views illustrating a LED module A3 according to a third embodiment. The same or similar elements as those of the first embodiment are denoted by the same reference numerals, and explanation of which will not be repeated. FIGS. 15A to 15C are plan views of a main part of the LED module A3. FIGS. 15A to 15C correspond to FIGS. 1A to 1C of the first embodiment, respectively. FIG. 16 is a side view of the LED module A3. FIG. 17 is a bottom view of the LED module A3. For convenience of understanding, the wiring pattern 200 and the insulating film 500 are hatched in FIGS. 15A to 17. In addition, the insulating film 500 is shown in phantom in FIG. 17.

Two corner grooves 151 and 152 and two side surface grooves 161 and 162 are formed in the module substrate 100. Therefore, the LED module A3 according to the third embodiment is different from the LED module A1 according to the first embodiment in that, instead of the two through-holes 141 and 142, the two side surface grooves 161 and 162 are formed in the module substrate 100.

Both of the side surface grooves 161 and 162 are recessed from the substrate side surface 124. The side surface grooves 161 and 162 reach the substrate main surface 110 and the substrate back surface 130 in the thickness direction (the z direction) of the module substrate 100. The sectional shapes of the side surface grooves 161 and 162 are semicircular. The side surface groove 161 is positioned in the +x direction with respect to the side surface groove 162. The side surface grooves 161 and 162 correspond to a "through portion" recited in the claims.

The LED module A3 according to this embodiment is different from the LED modules A1 and A2 in the configuration of the wiring pattern 200. The wiring pattern 200 includes a main surface electrode 210, a plurality of back surface electrodes (four back surface electrodes 271 to 274 in this embodiment), a plurality of corner groove electrodes (two corner groove electrodes 283 and 284 in this embodiment) and a plurality of side surface groove electrodes (two side surface groove electrodes 285 and 286 in this embodiment). Therefore, the LED module A3 is different from the LED modules A1 and A2 in that the side groove electrodes 285 and 286 are provided in place of the through electrodes 281 and 282.

In this embodiment, as shown in FIG. 15C, the main surface electrode 210 has three die pad portions 221 to 223, five wire bonding portions 231 to 235, two quarter annular wires 241 and 242, two semicircular annular wires 245 and 246, and five connection wires 259, 260, 261, 262 and 263.

The semicircular annular wiring 245 is formed in the vicinity of a portion of the substrate main surface 110 connected to the side surface groove 161. The semicircular annular wiring 246 is formed in the vicinity of a portion of the substrate main surface 110 connected to the side surface groove 162.

The connection wiring 259 connects the die pad portions 221 to 223 and the wire bonding portions 232 and 234. The connection wiring 259 has a strip portion 259a and a plurality of branch portions 259b, 259c, 259d and 259e. The strip portion 259a has a strip shape extending in the +x direction, and its end portion in the −x direction and the −y direction is connected to the die pad portion 223. The strip portion 259a is disposed near the edge of the substrate main surface 110 in the +y direction. The branch portion 259b extends in the −y direction from a portion of the strip portion 259a and is connected to the edge of the wire bonding portion 234 in the +y direction. The branch portion 259b overlaps the wire bonding portion 234 in the x direction. The branch portion 259c extends in the −y direction from a portion of the strip portion 259a and is connected to the edge of the die pad portion 222 in the +y direction. The branch portion 259c overlaps the die pad portion 222 in the x direction. The branch portion 259d extends in the −y direction from a portion of the strip portion 259a and is connected to the edge of the wire bonding portion 232 in the +y direction. The branch portion 259d overlaps the wire bonding portion 232 in the x direction. The branch portion 259e extends in the −y direction from a portion of the strip portion 259a and is connected to the edge of the die pad portion 221 in the +y direction. The branch portion 259e overlaps the die pad portion 221 in the x direction.

The connection wiring 260 connects the die pad portion 221 and the quarter annular wiring 241. The connection wiring 260 has a strip shape extending in the +y direction from the quarter annular wiring 241 and is connected to the die pad portion 221.

The connection wiring 261 connects the wire bonding portion 231 and the semicircular annular wiring 245. The connection wire 261 has a strip shape extending in the +y direction from the semicircular annular wiring 245 and a portion of its edge in the −x direction is connected to the wire bonding portion 231.

The connection wiring 262 connects the wire bonding portion 233 and the semicircular annular wiring 246. The connection wiring 262 has a strip shape extending in the +y direction from the semicircular annular wiring 246 and is connected to the wire bonding portion 233.

The connection wiring 263 connects the wire bonding portion 235 and the quarter annular wiring 242. The connection wiring 263 has a strip shape extending in the +y direction from the quarter annular wiring 242 and is connected to the wire bonding portion 235. The connection wiring 263 is biased to the edge of the substrate main surface 110 in the −x direction.

The side surface groove electrodes 285 and 286 are formed so as to cover the inner surfaces of the side surface grooves 161 and 162 of the module substrate 100, respectively. The side surface groove electrodes 285 and 286 extend from the substrate main surface 110 to the substrate back surface 130. The side surface groove electrode 285 is connected to the semicircular annular wiring 245 at the substrate main surface 110 side and is connected to the back surface electrode 272 at the substrate back surface 130 side. The side surface groove electrode 286 is connected to the semicircular annular wiring 246 at the substrate main surface 110 side and is connected to the back surface electrode 273 at the substrate back surface 130 side.

In the wiring pattern 200 according to this embodiment, the back surface electrode 271 makes electrical conduction with the quarter annular wiring 241, the connection wirings 260 and 259, the die pad portions 221, 222 and 223, and the wire bonding portions 232 and 234 via the corner groove electrode 283. The back surface electrode 272 makes electrical conduction with the semicircular annular wiring 245, the connection wiring 261, and the wire bonding portion 231 via the side surface groove electrode 285. The back surface electrode 273 makes electrical conduction with the semicircular annular wiring 246, the connection wiring 262, and the wire bonding portion 233 via the side surface groove electrode 286. The back surface electrode 274 makes electrical conduction with the quarter annular wiring 242, the connection wiring 263, and the wire bonding portion 235 via the corner groove electrode 284.

The LED chips 301 to 303 are connected by the wiring pattern 200 and the wires 401 to 405 configured as above and, as a result, the LED module A3 has the circuit configuration shown in FIG. 8, like the LED module A1. In this embodiment, like the first embodiment, the positive electrode terminal V+ corresponds to the back surface electrode 271 and the negative electrode terminals V1−, V2− and V3− correspond to the back surface electrodes 272, 273 and 274, respectively.

As with the LED module A1, the LED module A3 according to this embodiment is mounted on the mounting board B, as shown in FIGS. 10A and 10B. Therefore, the LED module A3 may also be mounted as either a side view type or a top view type.

The LED module A3 according to the third embodiment described above can achieve the same effects as the LED module A1 according to the first embodiment.

Figure 18A:
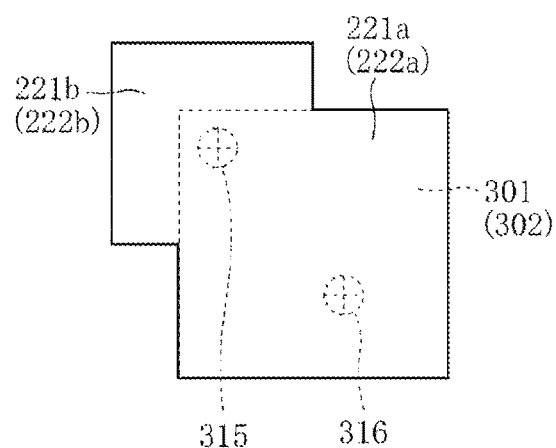
FIGS. 18A to 18E are views illustrating die pad portions according to modifications.
Figure 18B:
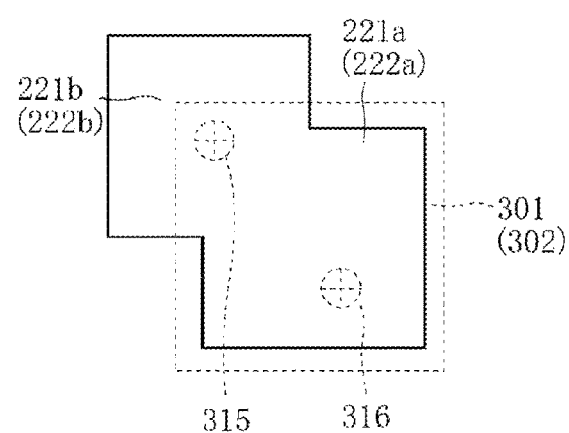

FIGS. 18A to 18E are view illustrating die pad portions 221 (222) according to modifications of the present disclosure. In FIGS. 18A to 18E, for convenience of understanding, the LED chips 301 and 302 are shown in phantom. For example, the case where the outer shape of the main pad portion 221a (222a) is larger than the outer shape of the LED chip 301 (302) in the z direction has been illustrated in the first to third embodiments, but the outer shape of the main pad portion 221a (222a) may have the same size as the outer shape of the LED chip 301 (302), as shown in FIG. 18A. Alternatively, as shown in FIG. 18B, the outer shape of the main pad portion 221a (222a) may be smaller than the outer shape of the LED chip 301 (302). By doing so, the size of the die pad portion 221 (222) can be further reduced when viewed from the z direction, thereby making it possible to reduce the size of the LED modules A1 to A3.

Figure 18C:
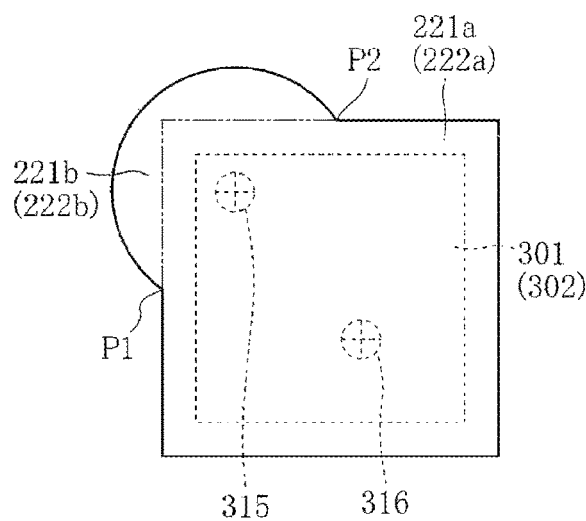

Further, as shown in FIG. 18C, the auxiliary pad portion 221b (222b) may have a circular shape protruding from the outer edge of the main pad portion 221a (222a). In this case, the auxiliary pad portion 221b (222b) may have a circular shape which centers on the position of the n side electrode pad 315 of the LED chip 301 (302) die-bonded to a predetermined position in the main pad portion 221a (222a) and has a circular arc passing through the connection points P and P2, when viewed from the z direction. Even in this case, as in the above-described modifications, the outer shape of the main pad portion 221a (222a) may be equal to or smaller than the outer shape of the LED chip 301 (302).

Figure 18D:
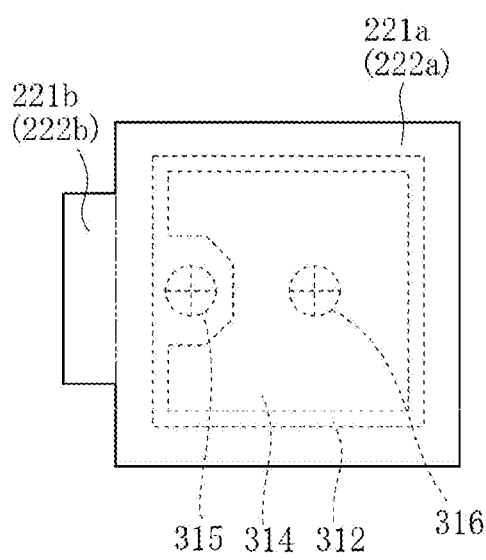
Figure 18E:
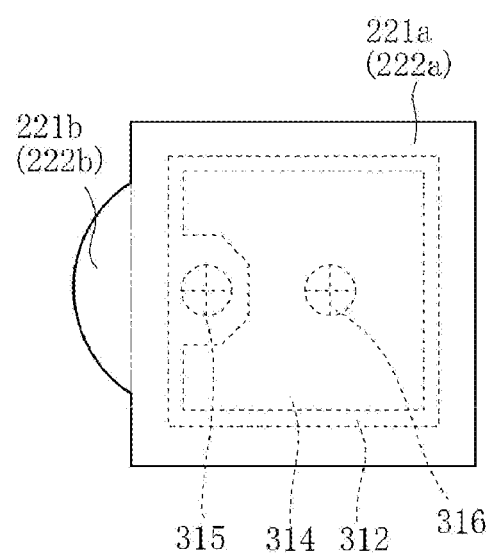
Figure 19A:
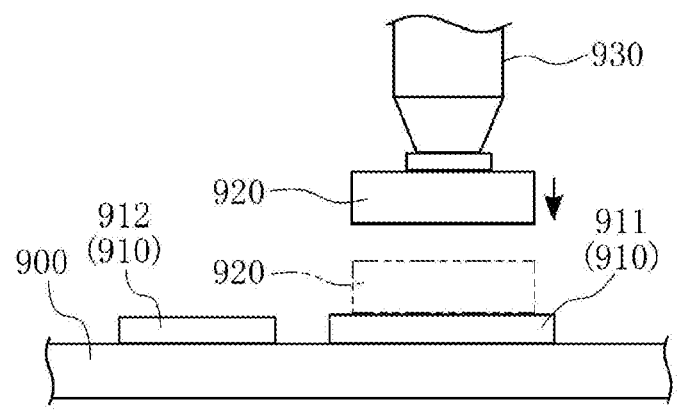
FIGS. 19A and 19B are views illustrating a die bonding process and a wire bonding process.
Figure 19B:
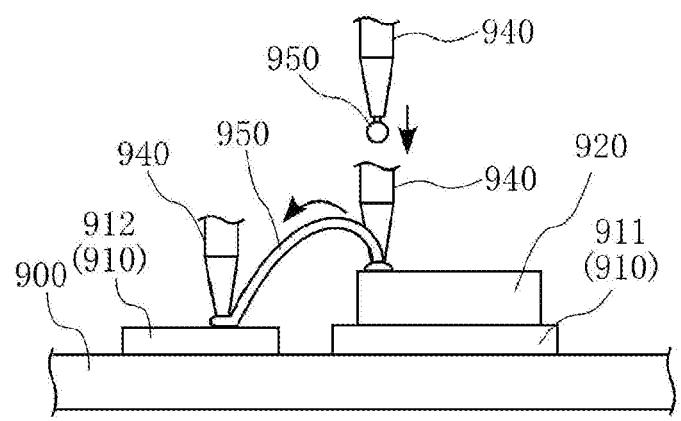
Figure 20A:
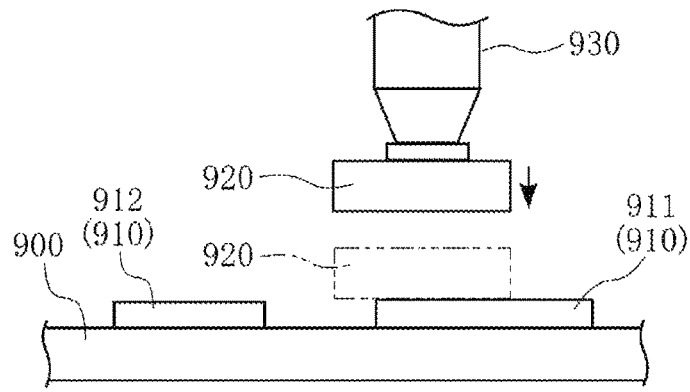
FIGS. 20A to 20C are views for explaining a problem in the related art.
Figure 20B:
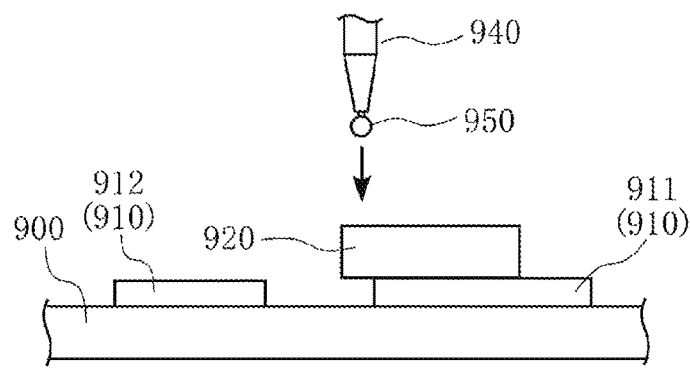
Figure 20C:
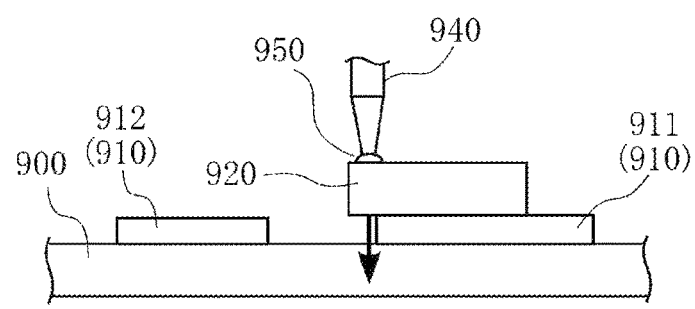

Further, the case where the n side electrode pad 315 of the LED chip 301 (302) is disposed at one end side of the diagonal line 331 has been illustrated in the first to third embodiments, but when then side electrode pad 315 is disposed as shown in FIGS. 18D and 18E, the auxiliary pad portion 221b (222b) may be set with reference to then side electrode pad 315. In this case, the auxiliary pad portion 221b (222b) may be formed in a rectangular shape as shown in FIG. 18D or in a circular shape as shown in FIG. 18E.

The case where the die pad portion 221 and the die pad portion 222 have the same shape has been illustrated in the first to third embodiments, but they may have different shapes. That is to say, the die pad portions shown in the above-described modifications may be used in combination.

The case where the wire electrode pad 325 of the LED chip 303 is located at the center in plan view has been illustrated in the first to third embodiments, but it may be disposed at the edge in plan view. In this case, according to the arrangement of the wire electrode pad 325, the auxiliary pad portion may be provided also in the die pad portion 223.

The case where the LED chips 301, 302, and 303 emit blue light, green light, and red light, respectively, has been illustrated in the first to third embodiments, but the emission color of the LED chips 301, 302, and 303 is not limited thereto. For example, all or two of them may be of the same color.

It has been illustrated in the first to third embodiments that the LED chip 303 is a one-wire type LED chip, but the LED chip 303 may be a two-wire type LED chip. Conversely, the LED chips 301 and 302 may be a one-wire type LED chip instead of a two-wire type LED chip. The case where the LED module has three LED chips 301 to 303 has been illustrated in the first to third embodiments, but the number of LED chips is not particularly limited. The LED module of the present disclosure may include at least one two-wire type LED chip.

The LED module according to the present disclosure is not limited to the above-described embodiments. The specific configuration of each part of the LED module according to the present disclosure can be variously changed in design without departing from the contents described in the claims of the present disclosure.

According to the present disclosure in some embodiments, in the first die pad portion, the auxiliary pad portion is formed by, instead of being uniformly enlarged from the outer periphery of the main pad portion in all four directions when viewed from the thickness direction, protruding from the main pad portion in the direction toward the position of the first electrode pad from the center position of the LED chip. Thus, it is possible to reduce the size of the first die pad portion in a plan view and it is possible to reduce the size of the LED module. Furthermore, even when misalignment occurs during the die bonding, it is possible to prevent an electrode pad (the first electrode pad) for bonding wires from protruding from the first die pad portion when viewed from the thickness direction.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED module comprising:
   a substrate having a main surface and a back surface which face in opposite directions from each other in a thickness direction;
   at least one first LED chip including a first electrode pad bonded to a surface facing the same direction as the main surface;
   a first wire having one end bonded to the first electrode pad; and
   a wiring pattern having a main surface electrode formed in the main surface,
   wherein the main surface electrode includes a first wire bonding portion to which the other end of the first wire is bonded, and a first die pad portion which supports the first LED chip,
   wherein the first electrode pad is biased to an outer edge of the first LED chip from a center position in the first LED chip when viewed from the thickness direction, and
   wherein the first die pad portion includes a main pad portion to which the first LED chip is bonded when viewed from the thickness direction, and an auxiliary pad portion which is formed integrally with the main pad portion and protrudes from the main pad portion in a direction toward a position of the first electrode pad from the center position in the first LED chip when viewed from the thickness direction.

2. The LED module of claim 1, wherein the first die pad portion has a first connection point at which a first outer edge of the main pad portion and a first outer edge of the auxiliary pad portion intersect each other on a first side of the main pad portion, and a second connection point at which a second outer edge of the main pad portion and a second outer edge of the auxiliary pad portion intersect each other on a second side of the main pad portion adjacent to the first side, when viewed from the thickness direction.

3. The LED module of claim 2, wherein a maximum dimension of the auxiliary pad portion in a direction in which the first and second connection points are separated from each other is larger than a distance between the first and second connection points.

4. The LED module of claim 3, wherein the first LED chip has a rectangular shape when viewed from the thickness direction.

5. The LED module of claim 4, wherein the first electrode pad is disposed on one diagonal line of the first LED chip.

6. The LED module of claim 5, wherein the first wire bonding portion is disposed on an extension of the diagonal line.

7. The LED module of claim 5, wherein the main pad portion has a rectangular shape when viewed from the thickness direction.

8. The LED module of claim 5, wherein a shape of the main pad portion is analogous to that of the first LED chip when viewed from the thickness direction.

9. The LED module of claim 7, wherein when viewed from the thickness direction, the auxiliary pad portion has a first side which extends from the first connection point in a direction perpendicular to the first side of the main pad portion connected to the first connection point, a second side which extends from the second connection point in the direction perpendicular to the second side of the main pad portion connected to the second connection point, a third side which extends from an end portion of the first side of the auxiliary pad portion in a direction parallel to the second side of the auxiliary pad portion, and a fourth side which extends from an end portion of the second side of the auxiliary pad portion in a direction parallel to the first side of the auxiliary pad portion and is connected to the third side.

10. The LED module of claim 9, wherein when the first LED chip is bonded to a predetermined position in the main pad portion, the first electrode pad is positioned at an intersection of a perpendicular bisector of the third side of the auxiliary pad portion and a perpendicular bisector of the fourth side of the auxiliary pad portion when viewed from the thickness direction.

11. The LED module of claim 10, wherein the third side and the fourth side of the auxiliary pad portion have the same length.

12. The LED module of claim 8, wherein when the first LED chip is bonded to a predetermined position of the main pad portion, the auxiliary pad portion has a circular shape which centers on the position of the first electrode pad and has a circular arc passing through the first and second connection points, and does not overlap the main pad portion, when viewed from the thickness direction.

13. The LED module of claim 1, wherein the first LED chip further includes a second electrode pad which is bonded to a surface facing the same direction as the main surface, and is separated from the first electrode pad when viewed from the thickness direction.

14. The LED module of claim 13, wherein a distance between the second electrode pad and the center position in the first LED chip is shorter than a distance between the first electrode pad and the center position in the first LED chip when viewed from the thickness direction.

15. The LED module of claim 14, wherein the surface to which the second electrode pad is bonded is closer to the back surface side than the surface to which the first electrode pad is bonded, when viewed from the thickness direction.

16. The LED module of claim 15, wherein the first LED chip includes a semiconductor substrate, an n-type semiconductor layer, an active layer, and a p-type semiconductor layer,
wherein the first electrode pad is an n side electrode pad bonded to the n-type semiconductor layer, and
wherein the second electrode pad is a p side electrode pad bonded to the p-type semiconductor layer.

17. The LED module of claim 13, further comprising:
a second wire having one end bonded to the second electrode pad,
wherein the main surface electrode includes a second wire bonding portion to which the other end of the second wire is bonded.

18. The LED module of claim 17, wherein the main surface electrode includes a connection wiring connected to the first die pad portion and the second wire bonding portion.

19. The LED module of claim 1, wherein the wiring pattern has a back surface electrode formed in the back surface of the substrate.

20. The LED module of claim 19, wherein the wiring pattern includes a through electrode which is connected to the main surface electrode and the back surface electrode and passes through the substrate.

21. The LED module of claim 20, wherein the through electrode is a via hole which penetrates through the substrate in the thickness direction and is filled with a conductive material.

22. The LED module of claim 20, wherein the through electrode is a plating formed in an inner surface of a through portion penetrating through the substrate in the thickness direction.

23. The LED module of claim 1, further comprising an insulating film covering a portion of the wiring pattern.

24. The LED module of claim 1, further comprising a housing disposed on the main surface of the substrate so as to surround the first LED chip.

25. The LED module of claim 1, wherein the LED module comprises a plurality of first LED chips.

26. The LED module of claim 25, wherein the LED module comprises three first LED chips which emit a green light, blue light, and red light, respectively.

27. The LED module of claim 26, further comprising:
at least one second LED chip of a one-wire type including: a wire electrode pad to which one end of a third wire is bonded; and a bottom electrode which is positioned in an opposite side of the wire electrode pad and is bonded to the main surface electrode.

28. The LED module of claim 27, wherein the main surface electrode includes a second die pad portion which supports the second LED chip and to which the bottom electrode is conductively bonded.

29. The LED module of claim 28, wherein the main surface electrode further includes a third wire bonding portion to which the other end of the third wire is bonded.

30. The LED module of claim 27, wherein the LED module comprises two first LED chips and one second LED chip and the one second LED chip emits red light.

* * * * *